US008206507B2

(12) United States Patent
Yamazaki et al.

(10) Patent No.: US 8,206,507 B2
(45) Date of Patent: Jun. 26, 2012

(54) EVAPORATION METHOD, EVAPORATION DEVICE AND METHOD OF FABRICATING LIGHT EMITTING DEVICE

(75) Inventors: Shunpei Yamazaki, Tokyo (JP); Masakazu Murakami, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/487,843

(22) Filed: Jun. 19, 2009

(65) Prior Publication Data

US 2009/0269486 A1    Oct. 29, 2009

Related U.S. Application Data

(63) Continuation of application No. 10/438,190, filed on May 15, 2003.

(30) Foreign Application Priority Data

May 17, 2002 (JP) ................................. 2002-143822

(51) Int. Cl.
C23C 16/00 (2006.01)
(52) U.S. Cl. ....................................... 118/727; 118/726
(58) Field of Classification Search .................. 118/727, 118/726
See application file for complete search history.

(56) References Cited

U.S. PATENT DOCUMENTS

| 2,435,997 | A |   | 2/1948  | Bennett           |         |
|-----------|---|---|---------|-------------------|---------|
| 3,241,519 | A | * | 3/1966  | Lloyd             | 118/720 |
| 3,312,190 | A |   | 4/1967  | Bradshaw          |         |
| 3,931,490 | A |   | 1/1976  | Grothe et al.     |         |
| 3,971,334 | A |   | 7/1976  | Pundsack          |         |
| 4,023,523 | A |   | 5/1977  | Ing               |         |
| 4,187,801 | A |   | 2/1980  | Monk              |         |
| 4,543,467 | A |   | 9/1985  | Eisele et al.     |         |
| 4,627,989 | A |   | 12/1986 | Feuerstein et al. |         |
| 4,854,264 | A |   | 8/1989  | Noma et al.       |         |
| 4,885,211 | A |   | 12/1989 | Tang et al.       |         |
| 4,897,290 | A |   | 1/1990  | Terasaka et al.   |         |
| 4,951,601 | A |   | 8/1990  | Maydan et al.     |         |
| 5,041,719 | A | * | 8/1991  | Harris et al.     | 219/390 |
| 5,258,325 | A |   | 11/1993 | Spitzer et al.    |         |
| 5,429,884 | A |   | 7/1995  | Namiki et al.     |         |
| 5,444,811 | A | * | 8/1995  | Yoshimura et al.  | 385/141 |

(Continued)

FOREIGN PATENT DOCUMENTS

EP    0 271 351 A2    6/1988

(Continued)

OTHER PUBLICATIONS

English abstract JP 63079959, Misumi, Apr. 1988.*

(Continued)

*Primary Examiner* — Keath Chen

(74) *Attorney, Agent, or Firm* — Nixon Peabody LLP; Jeffrey L. Costellia

(57) ABSTRACT

The invention provides an evaporation apparatus, which is able to improve an efficiency of evaporation materials, uniformity of deposited films, and throughput of the evaporation process. Disclosed is an evaporation source holder, which is installed in an evaporation chamber and configured to hold an evaporation material, and a moving mechanism, which is configured to move the evaporation source holder during evaporation of the evaporation material. The evaporation apparatus is further characterized by a shutter over the evaporation source holder, a filter over the shutter, and a heater surrounding the filter.

7 Claims, 19 Drawing Sheets

U.S. PATENT DOCUMENTS

| | | | |
|---|---|---|---|
| 5,505,781 A * | 4/1996 | Omori et al. | 118/726 |
| 5,614,254 A | 3/1997 | Murata et al. | |
| 5,695,564 A | 12/1997 | Imahashi | |
| 5,817,366 A | 10/1998 | Arai et al. | |
| 5,906,857 A * | 5/1999 | McKee et al. | 427/8 |
| 6,001,413 A | 12/1999 | Matsuura et al. | |
| 6,049,167 A | 4/2000 | Onitsuka et al. | |
| 6,132,280 A | 10/2000 | Tanabe et al. | |
| 6,179,923 B1 | 1/2001 | Yamamoto et al. | |
| 6,237,529 B1 | 5/2001 | Spahn | |
| 6,244,212 B1 | 6/2001 | Takacs et al. | |
| 6,326,726 B1 | 12/2001 | Mizutani et al. | |
| 6,329,229 B1 | 12/2001 | Yamazaki et al. | |
| 6,331,212 B1 | 12/2001 | Mezey | |
| 6,356,032 B1 | 3/2002 | Suzuki et al. | |
| 6,364,956 B1 | 4/2002 | Wang et al. | |
| 6,382,895 B1 | 5/2002 | Konishi et al. | |
| 6,383,402 B1 | 5/2002 | Smith et al. | |
| 6,391,114 B1 | 5/2002 | Kirimura | |
| 6,403,392 B1 | 6/2002 | Burrows et al. | |
| 6,444,043 B1 * | 9/2002 | Gegenwart et al. | 118/726 |
| 6,482,752 B1 | 11/2002 | Yamazaki et al. | |
| 6,506,453 B2 | 1/2003 | Ema et al. | |
| 6,513,451 B2 | 2/2003 | Van Slyke et al. | |
| 6,641,674 B2 | 11/2003 | Peng | |
| 6,699,739 B2 | 3/2004 | Yamazaki et al. | |
| 6,933,015 B2 | 8/2005 | Kitano et al. | |
| 7,022,535 B2 | 4/2006 | Yamazaki et al. | |
| 7,195,801 B2 | 3/2007 | Murakami et al. | |
| 7,309,269 B2 | 12/2007 | Yamazaki et al. | |
| 7,342,355 B2 | 3/2008 | Seo et al. | |
| 2001/0006827 A1 | 7/2001 | Yamazaki et al. | |
| 2001/0009154 A1 | 7/2001 | Nguyen et al. | |
| 2001/0011524 A1 * | 8/2001 | Witzman et al. | 118/718 |
| 2001/0022272 A1 | 9/2001 | Plester et al. | |
| 2002/0009538 A1 * | 1/2002 | Arai | 427/66 |
| 2002/0011205 A1 * | 1/2002 | Yamazaki et al. | 118/620 |
| 2002/0076847 A1 | 6/2002 | Yamada et al. | |
| 2002/0081372 A1 | 6/2002 | Peng | |
| 2002/0197418 A1 | 12/2002 | Mizukami et al. | |
| 2002/0197760 A1 | 12/2002 | Yamazaki et al. | |
| 2003/0000645 A1 | 1/2003 | Dornfest | |
| 2003/0015140 A1 * | 1/2003 | Van Slyke et al. | 118/723 VE |
| 2003/0101937 A1 * | 6/2003 | Van Slyke et al. | 118/726 |
| 2003/0162314 A1 | 8/2003 | Yamazaki et al. | |
| 2003/0194484 A1 | 10/2003 | Yamazaki et al. | |
| 2004/0144321 A1 * | 7/2004 | Grace et al. | 118/726 |
| 2005/0183670 A1 * | 8/2005 | Grantham et al. | 118/726 |
| 2006/0197080 A1 | 9/2006 | Yamazaki et al. | |
| 2008/0282984 A1 | 11/2008 | Yamazaki et al. | |
| 2009/0074952 A1 | 3/2009 | Yamazaki et al. | |
| 2009/0075411 A1 | 3/2009 | Yamazaki et al. | |
| 2010/0021624 A1 | 1/2010 | Yamazaki et al. | |

FOREIGN PATENT DOCUMENTS

| | | |
|---|---|---|
| EP | 0 865 229 A2 | 9/1998 |
| EP | 0 998 170 A2 | 5/2000 |
| EP | 1 033 750 A1 | 9/2000 |
| EP | 1 113 087 A2 | 7/2001 |
| EP | 1 132 980 A2 | 9/2001 |
| EP | 1 207 557 A2 | 5/2002 |
| EP | 1 338 673 A1 | 8/2003 |
| EP | 1 369 499 A2 | 12/2003 |
| JP | 54-127877 | 10/1979 |
| JP | 62 180063 | 8/1987 |
| JP | 63-079959 | 4/1988 |
| JP | 63079959 * | 4/1988 |
| JP | 63-149371 | 6/1988 |
| JP | 03-197668 | 8/1991 |
| JP | 05-062186 A | 3/1993 |
| JP | 05-230627 A | 9/1993 |
| JP | 06-228740 A | 8/1994 |
| JP | 07-126838 | 5/1995 |
| JP | 09-272703 A | 10/1997 |
| JP | 10-025563 | 1/1998 |
| JP | 10-041069 | 2/1998 |
| JP | 10-168559 | 6/1998 |
| JP | 11 061398 | 3/1999 |
| JP | 11-126686 | 5/1999 |
| JP | 2000-133446 | 5/2000 |
| JP | 2000-223269 | 8/2000 |
| JP | 2000-303168 A | 10/2000 |
| JP | 2000-315576 | 11/2000 |
| JP | 2000-328229 | 11/2000 |
| JP | 2001-059161 | 3/2001 |
| JP | 2001-093667 | 4/2001 |
| JP | 2001-152336 | 6/2001 |
| JP | 2001-247959 | 9/2001 |
| JP | 2001-284048 | 10/2001 |
| JP | 2001-345177 | 12/2001 |
| JP | 2003-002778 | 1/2003 |
| JP | 2003-034591 | 2/2003 |
| JP | 2003-095787 | 4/2003 |
| JP | 2003-301259 | 10/2003 |
| JP | 2003-313655 | 11/2003 |
| JP | 2003-332052 | 11/2003 |
| JP | 2004-006311 | 1/2004 |
| JP | 2004-035964 | 2/2004 |
| KR | 1998-0080038 A | 11/1998 |
| KR | 2000-0034932 A | 6/2000 |
| KR | 2002-0025760 | 4/2002 |
| WO | WO 01/31081 | 12/1998 |
| WO | WO 98/54375 | 12/1998 |

OTHER PUBLICATIONS

Office Action (Application No. 2003-0031311;KR06436) Dated September 14, 2009.

KIPO Office Action (Application No. 10-2009-0122229;KR06436D2) Dated Feb. 23, 2010.

Tang C. et al., "Organic Electroluminescent Diodes,", Appl. Phys. Lett. (Applied Physics Letters), Sep. 21, 1987, vol. 51, No. 12, pp. 913-915.

Fukuda Y. et al., "An Organic LED Display Exhibiting Pure RGB Colors,", Synthetic Metals, 2000, vol. 111-112, pp. 1-6.

* cited by examiner

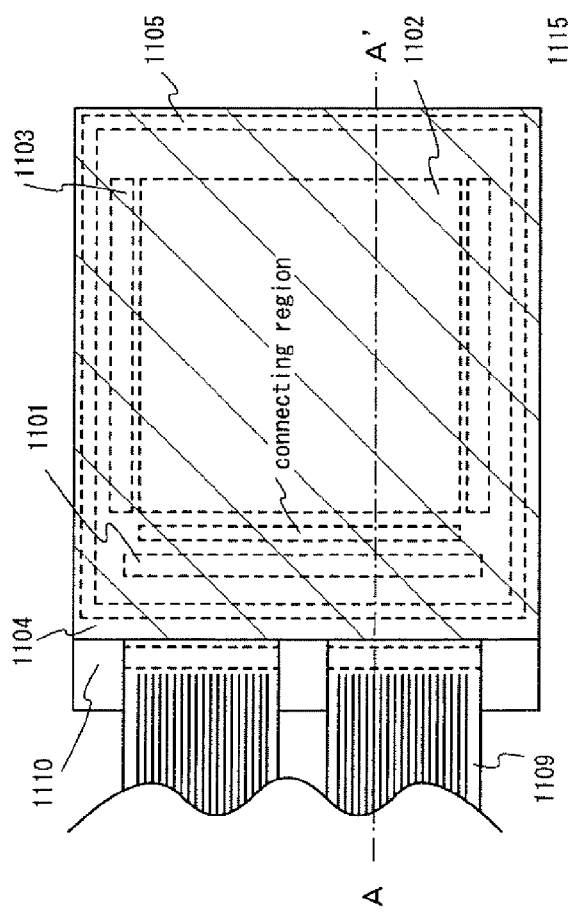
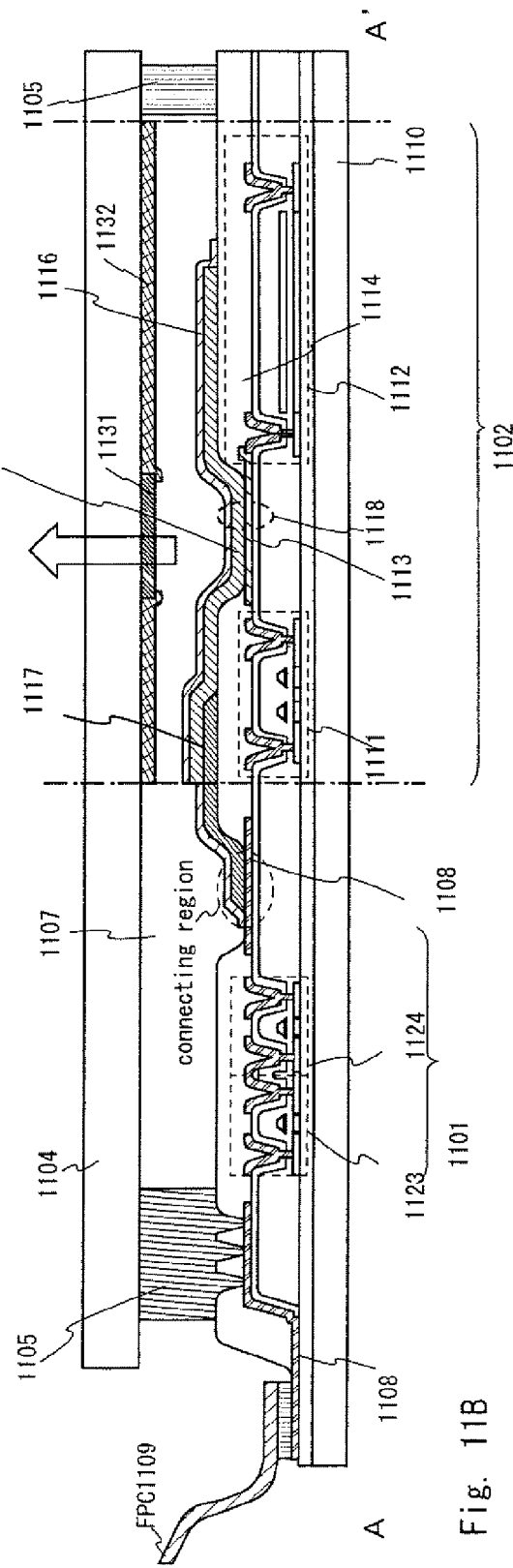
Fig. 11A
Fig. 11B

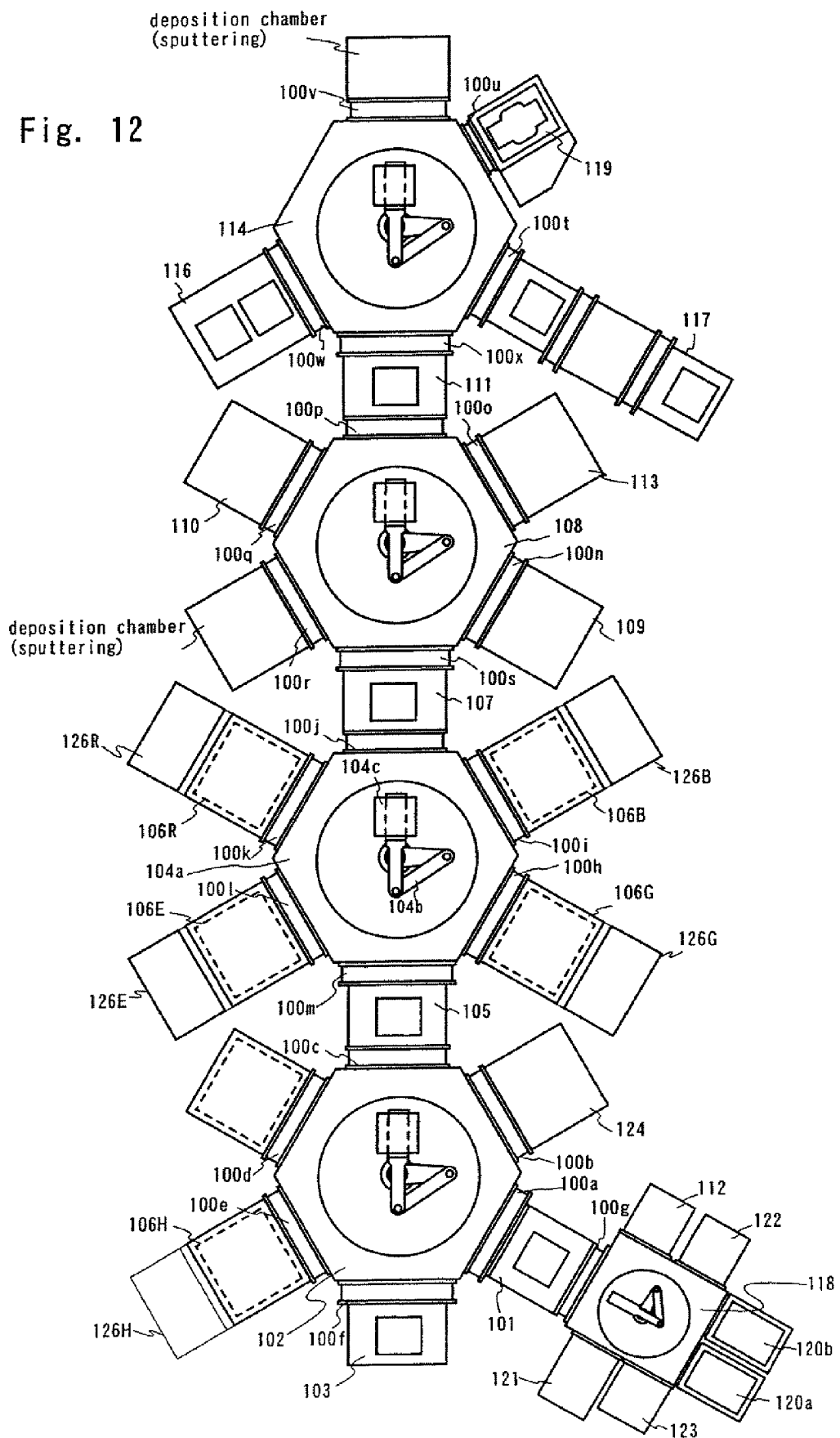

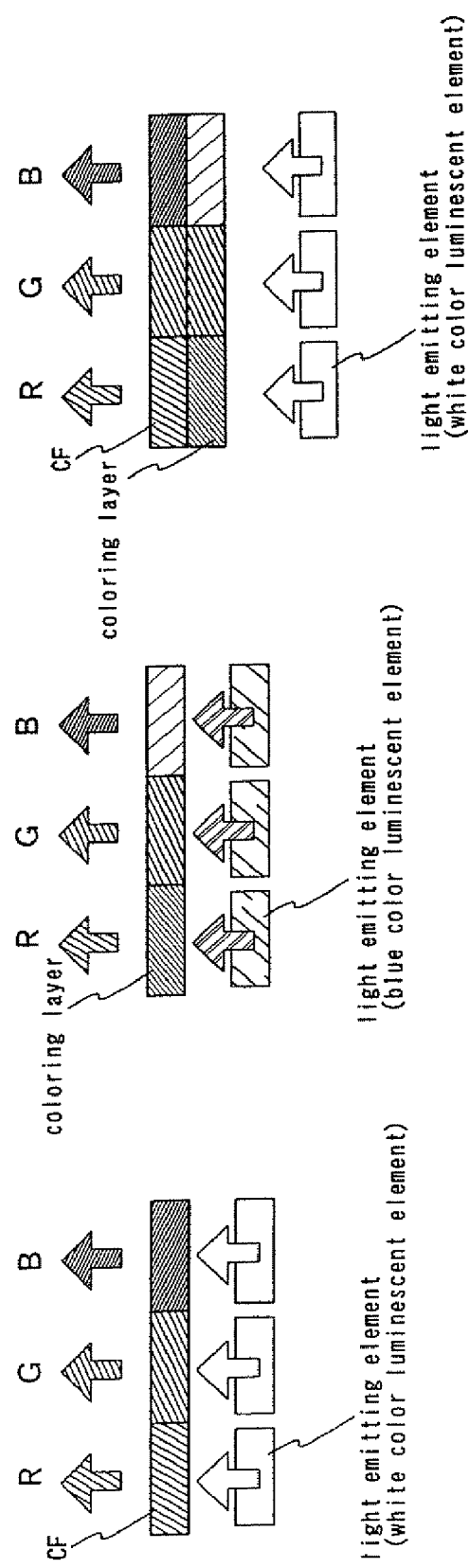

EVAPORATION METHOD, EVAPORATION DEVICE AND METHOD OF FABRICATING LIGHT EMITTING DEVICE

BACKGROUND OF THE INVENTION

The present invention relates to a deposition device for depositing materials which can be deposited by evaporation (hereinafter, an evaporation material), and a manufacturing method of a light emitting device typified by OLED that is formed using the deposition device. Specifically, the present invention relates to a vacuum-evaporation method and an evaporation device that conducts deposition by evaporating an evaporation material from a plurality of evaporation sources provided to face a substrate.

In recent years, research related to a light emitting device having an EL element as a self-luminous light emitting element has been activated. The light emitting device is referred to as EL display or light emitting diode (LED). Since these light emitting devices have characteristics such as rapid speed of response that is suitable for movie display, low voltage, low power consumption driving, or the like, they attracts an attention for a next generation display including new generation's cellular phones and portable information terminals (PDA).

The EL element has a structure that an organic compound-containing layer (hereinafter, an EL layer) is sandwiched between an anode and a cathode. Electro luminescence is generated in the EL layer by applying an electronic field to the anode and the cathode. Luminescence obtained from the EL element includes light emission in returning to a base state from singlet excitation (fluorescence) and light emission in returning to a base state from triplet excitation (phosphorescence).

Above EL layer has a laminated structure typified by "a hole transporting layer, a light emitting layer, an electron transporting layer" proposed by Tang et el. of Kodak Eastman Company. An EL material for forming an EL layer is classified broadly into a low-molecular (monomer) material and high-molecular (polymer) material. The low-molecular material is deposited using the evaporation apparatus shown in FIG. 14.

The evaporation apparatus shown in FIG. 14 has a substrate holder 1403 installed on a substrate, a melting pot 1401 encapsulated an EL material, an evaporation material, a shutter 1402 for prevention of rising an EL material that will be sublimed, and a heater (not shown) for heating an EL material in a melting pot. Then, an EL material heated by the heater is sublimed and deposited on a rolling substrate. At this time, in order to deposit uniformly, the substrate and the melting pot is necessary to have a distance therebetween at least 1 m.

According to the above-described evaporation device and the above-described vacuum evaporation method, when the EL layer is formed by vacuum evaporation, almost all of the sublimated EL material is adhered to an inner wall, a shutter or an adherence preventive shield (protective plate for preventing a vacuum evaporation material from adhering to an inner wall of a deposition chamber) at inside of the deposition chamber of the evaporation device. Therefore, in forming the EL layer, an efficiency of utilizing the expensive EL material is as extremely low as about 1% or smaller and fabricating cost of a light emitting device becomes very expensive.

Further, according to the evaporation device of the related art, in order to provide a uniform film, it is necessary to separate a substrate from an evaporation source by an interval equal to or larger than 1 m. Therefore, the evaporation device per se becomes large-sized, a time period required for emptying gas from each deposition chamber of the evaporation device is prolonged and therefore, a deposition rate is retarded and throughput is lowered. Further, the evaporation device is of a structure of rotating the substrate and therefore, there is a limit in the evaporation device aiming at a large area substrate.

Further, the EL material poses a problem of being deteriorated by being easily oxidized by presence of oxygen or water. However, in forming a film by an evaporation method, a predetermined amount of an evaporation material put into a vessel (glass bottle) is taken out and transferred to a vessel (representatively, crucible, or evaporation boat) installed at a position opposed to an object to be formed with a film at inside of an evaporation device stem and there is a concern that the evaporation material is mixed with oxygen or water or an impurity in the transferring operation.

Further, when the evaporation material is transferred from the glass bottle to the vessel, the evaporation material is transferred by the human hand at inside of a pretreatment chamber of a deposition chamber provided with a glove or the like. However, when the glove is provided at the pretreatment chamber, vacuum cannot be constituted, the operation is carried out under atmospheric pressure and there is a high possibility of mixing an impurity. For example, even when the transferring operation is carried out at inside of the pretreatment chamber subjected under a nitrogen atmosphere, it is difficult to reduce moisture or oxygen as less as possible. Further, although it is conceivable to use a robot, since the evaporation material is in a powder-like shape, it is very difficult to fabricate the robot for carrying out the transferring operation. Therefore, it is difficult to constitute steps of forming an EL element, that is, from a step of forming an EL layer above a lower electrode to a step of forming an upper electrode by an integrated closed system enabling to avoid mixing of an impurity.

SUMMARY OF THE INVENTION

Hence, the invention provides an evaporation device which is a deposition device promoting an efficiency of utilizing an EL material and forming film excellent in uniformity or throughput of forming an EL layer and an evaporation method therefor. Further, the invention provides a light emitting device fabricated by the evaporation device and the evaporation method according to the invention and a method of fabricating the light emitting device.

Further, the invention provides a method of subjecting an EL material to evaporation efficiently to a large area substrate having a substrate size of, for example, 320 mm×400 mm, 370 mm×470 mm, 550 mm×650 mm, 600 mm×720 mm, 680 mm×580 mm, 100 mm×1200 mm, 1100 mm×1250 mm or 1150 mm×1300 mm.

Further, the invention provides a fabricating device capable of avoiding an impurity from mixing to an EL material.

In order to achieve the above-described object, the invention provides an evaporation device featured in that a substrate and an evaporation source are moved relative to each other. That is, the invention is characterized in that in an evaporation device, an evaporation source holder installed with a vessel filled with an evaporation material is moved by a certain pitch relative to a substrate or the substrate is moved by a certain pitch relative to the evaporation source. Further, it is preferable to move the evaporation source holder by a certain pitch to overlap ends (skirts) of a sublimated evaporation material.

Although a single or a plurality of the evaporation source holders may be constituted, when the evaporation source holders are provided for respective laminated films of EL layers, evaporation can be carried out efficiently and continuously. Further, a single or a plurality of vessels may be installed at the evaporation source holder and a plurality of vessels filled with the same evaporation material may be installed. Further, when vessels having different evaporation materials are arranged, a film can be formed at a substrate in a state of mixing the sublimated evaporation materials (this is referred to as common evaporation).

Next, an explanation will be given of an outline of a path for moving a substrate and an evaporation source according to the invention relative to each other. Further, although the explanation will be given by an example of moving the evaporation source holder relative to the substrate in reference to FIGS. 2A and 2B, according to the invention, the substrate and the evaporation source may be moved relative to each other and the path of moving the evaporation source holder is not limited to those in FIGS. 2A and 2B. Further, although the explanation will be given of a case of four evaporation source holders A, B, C and D, any number of the evaporation source holders may naturally be provided.

FIG. 2A illustrates a substrate 13, evaporation source holders A, B, C and D installed with evaporation sources, and a path for moving the evaporation source holders A, B, C and D relative to the substrate. First, the evaporation source holder A is moved successively in an X axis direction to finish forming a film in the X axis direction as shown by a broken line. Next, the evaporation source holder A is moved successively in a Y axis direction and stopped at a position of a dotted line after finishing to form a film in the Y axis direction. Thereafter, the evaporation source holders B, C and D are successively moved similarly in the X axis direction to finish forming films in the X axis direction similarly. Next, the evaporation source holders B, C and D are successively moved in the Y axis direction and stopped after finishing to form films in the Y axis direction. Further, the evaporation holder may start moving from the Y axis direction and the path of moving the evaporation source holder is not limited to that of FIG. 2A. Further, the evaporation source holder may move alternately in the X axis direction and the Y axis direction. Further, by moving the evaporation source holder on an outer side of the substrate, evaporation to an end region of the substrate can be made uniform. Further, in order to make the evaporation to the end region of the substrate uniform, speed of moving at the end region may be made slower than that at a central region thereof.

Further, each evaporation source holder returns to an original position and starts evaporation for a succeeding substrate. A timing of returning each evaporation source holder to the original position may be a timing after forming the film and before successively forming the film and may be in the midst of forming a film by other evaporation source holder. Further, evaporation may be started for a succeeding substrate from a position at which each evaporation source holder is stopped. Although a time period of reciprocating the evaporation source holder once may pertinently be set by a person for embodying the invention, 5 through 15 minutes are preferable.

Next, a path different from that of FIG. 2A will be explained in reference to FIG. 2B. In reference to FIG. 2B, the evaporation source holder A is moved successively in the Y axis direction and moved successively in the X axis direction as shown by a broken line and stopped on a rear side of the evaporation source holder D as shown by a dotted line. Thereafter, the evaporation source holders B, C and D are moved in the X axis direction as shown by the broken line and successively moved in the Y axis direction similarly and stopped on rear sides of preceding ones of the evaporation source holders after finishing to form films.

By setting the path such that the evaporation source holder returns to the original position in this way, there is not unnecessary movement of the evaporation source holder and the deposition speed can be increased and therefore, the throughput of the light emitting device can be promoted.

Further, in FIGS. 2A and 2B, timings of starting to move the evaporation source holders A, B, C and D may be after stopping or before stopping preceding ones of the evaporation source holders. Further, when a succeeding one of the evaporation source holder starts moving before solidifying a vapor-deposited film, in an EL layer having a laminated layers structure, a region mixed with evaporation materials (mixed region) may be formed at an interface of respective films.

According to the invention of moving the substrate and the evaporation source holders A, B, C and D relative to each other in this way, small-sized formation of the device can be achieved without needing to prolong a distance between the substrate and the evaporation source holder. Further, since the evaporation device is small-sized, adherence of the sublimated evaporation material to the inner wall or the adherence preventive shield at inside of the deposition chamber is reduced and the evaporation material can be utilized without waste. Further, according to the evaporation method of the invention, it is not necessary to rotate the substrate and therefore, the evaporation device capable of dealing with a large area substrate can be provided. Further, according to the invention of moving the evaporation source holder in the X axis direction and the Y axis direction relative to the substrate, the vapor-deposited film can uniformly be formed.

Further, the invention can provide a fabricating device continuously arranged with a plurality of deposition chambers for carrying out an evaporation processing. The evaporation processing is carried out at the plurality of deposition chambers in this way and therefore, the throughput of the light emitting device is promoted.

Further, the invention can provide a fabricating system enabling to install a vessel filled with an evaporation material directly to the evaporation device without being exposed to the atmosphere. According to the invention, handling of the evaporation material is facilitated and an impurity can be avoided from being mixed to the evaporation material.

BRIEF DESCRIPTION OF THE DRAWINGS

FIGS. 11A and 11B are views showing a light emitting device according to the invention;

FIG. 12 is a view showing an evaporation device according to the invention;

FIGS. 18A, 18B and 18C are views showing a light emitting device according to the invention.

DETAILED DESCRIPTION OF PREFERRED EMBODIMENTS

An explanation will be given of embodiments of the invention in reference to the drawings as follows. Further, in all of views for explaining the embodiments, the same portions are attached with the same notations and a repeated explanation thereof will be omitted.

Embodiment 1

Figure 1A:
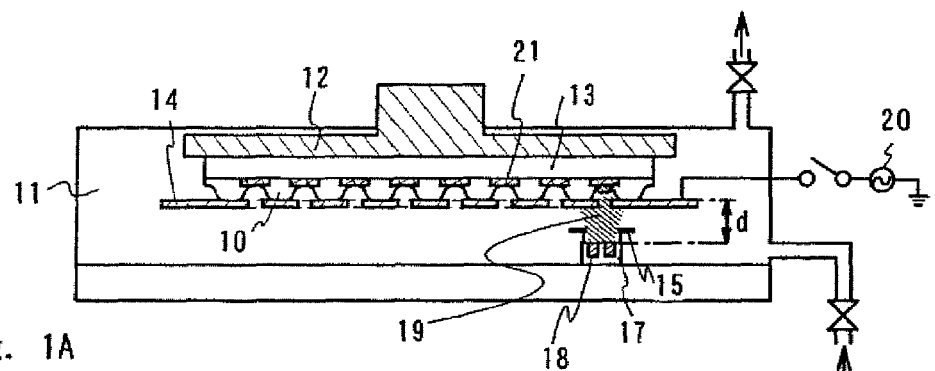
FIGS. 1A, 1B and 1C are views showing an evaporation device according to the invention.
Figure 1B:
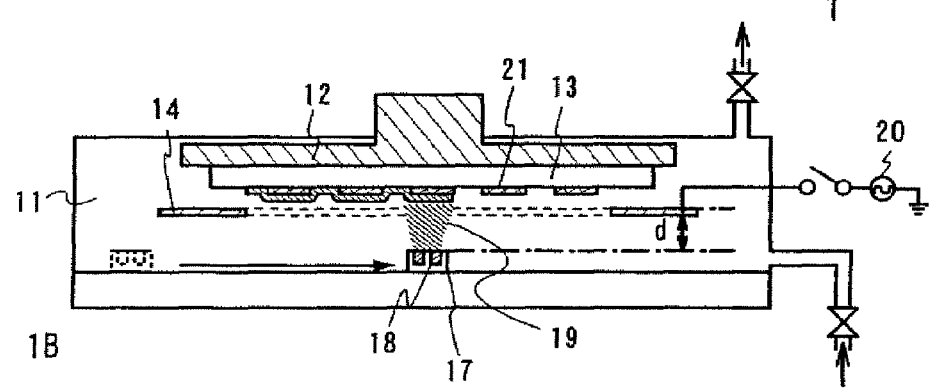
Figure 1C:
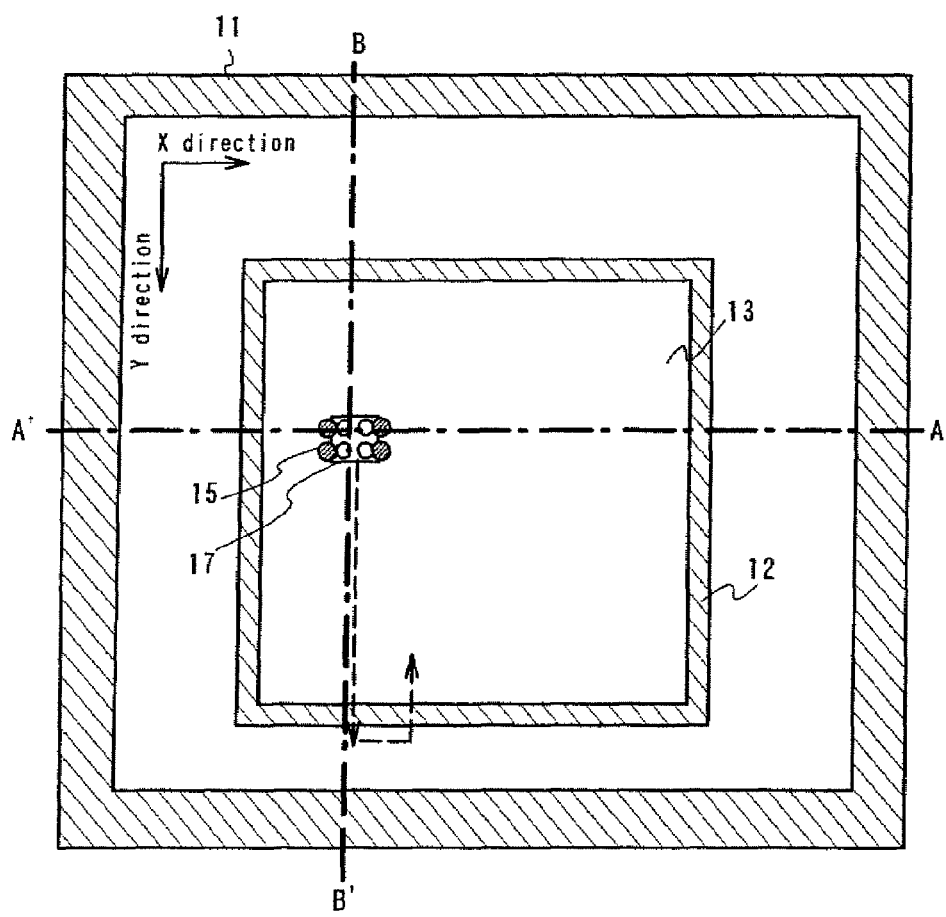

FIGS. 1A, 1B and 1C show an evaporation device according to the invention. FIG. 1A is a sectional view in X direction (a section taken along a dotted line A-A'), FIG. 1B is a sectional view in Y direction (a section taken along a dotted line B-B') and FIG. 1C is a top view. Further, FIGS. 1A, 1B and 1C show the evaporation device in the midst of evaporation.

In FIGS. 1A, 1B and 1C, a deposition chamber 11 includes a substrate holder 12, an evaporation source holder 17 installed with an evaporation shutter 15, means for moving the evaporation source holder (not illustrated) and means for producing a low pressure atmosphere. Further, the deposition chamber 11 is installed with a substrate 13 and an evaporation mask 14. Further, alignment of the evaporation mask may be confirmed by using a CCD camera (not illustrated). The evaporation source holder 17 is installed with a vessel filled with an evaporation material 18. The deposition chamber 11 is vacuumed to a vacuum degree of $5 \times 10^{-3}$ Torr (0.665 Pa) or lower, preferably, $10^{-4}$ through $10^{-6}$ Pa by the means for producing the low pressure atmosphere.

Further, in evaporation, the evaporation material is previously sublimated (vaporized) by resistance heating and scattered in a direction of the substrate 13 by opening the shutter 15 in evaporation. An evaporated evaporation material 19 is scattered in an upward direction and is selectively vapor-deposited on the substrate 13 by passing an opening portion provided at the evaporation mask 14. Further, preferably, a deposition rate, a moving speed of the evaporation holder and opening and closing of the shutter are controlled by a microcomputer. The evaporation rate of the evaporation source holder can be controlled by the moving speed.

Further, although not illustrated, evaporation can be carried out while measuring a film thickness of a deposited film by a quartz oscillator provided at the deposition chamber 11. When the film thickness of the deposited film is measured by using the quartz oscillator, a change in mass of a film deposited to the quartz oscillator can be measured as a change in the resonance frequency.

In the evaporation device stem shown in FIGS. 1A-1C, in evaporation, a distance d of an interval between the substrate 13 and the evaporation source holder 17 can be reduced to, representatively, 30 cm or smaller, preferably, 20 cm or smaller, further preferably, 5 cm through 15 cm to thereby significantly promote an efficiency of utilizing the evaporation material and throughput.

In the evaporation device, the evaporation source holder 17 is constituted by a vessel (representatively, crucible), a heater arranged on an outer side of the vessel via a uniformly heating member, an insulating layer provided on an outer side of the heater, an outer cylinder containing these, a cooling pipe wound around an outer side of the outer cylinder and the evaporation shutter 15 for opening and closing an opening portion of the outer cylinder including an opening portion of a crucible. Further, the evaporation source holder 17 may be a vessel capable of being carried in a state of fixing the heater to the vessel. Further, the vessel is formed by a material of a sintered body of BN, a composite sintered body of BN and AlN, quartz or a graphite capable of withstanding high temperature, high pressure and low pressure.

Figure 2A:
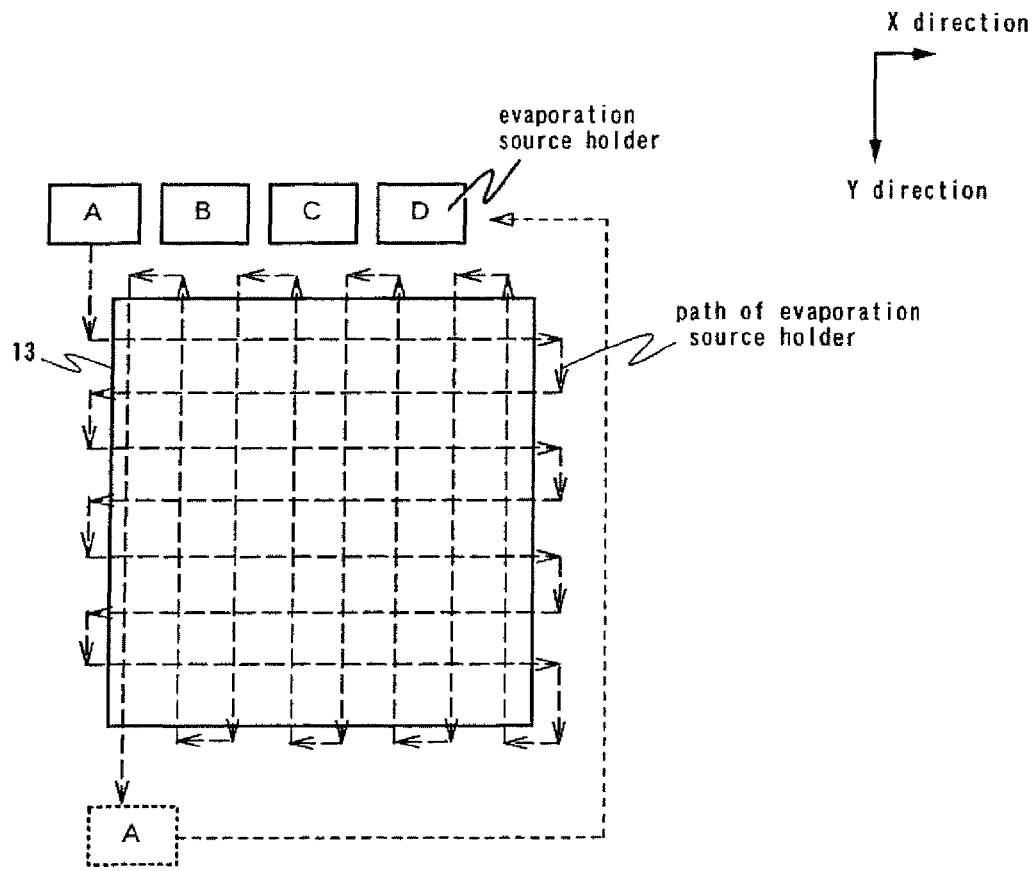
FIGS. 2A and 2B are views showing an evaporation device according to the invention.
Figure 2B:
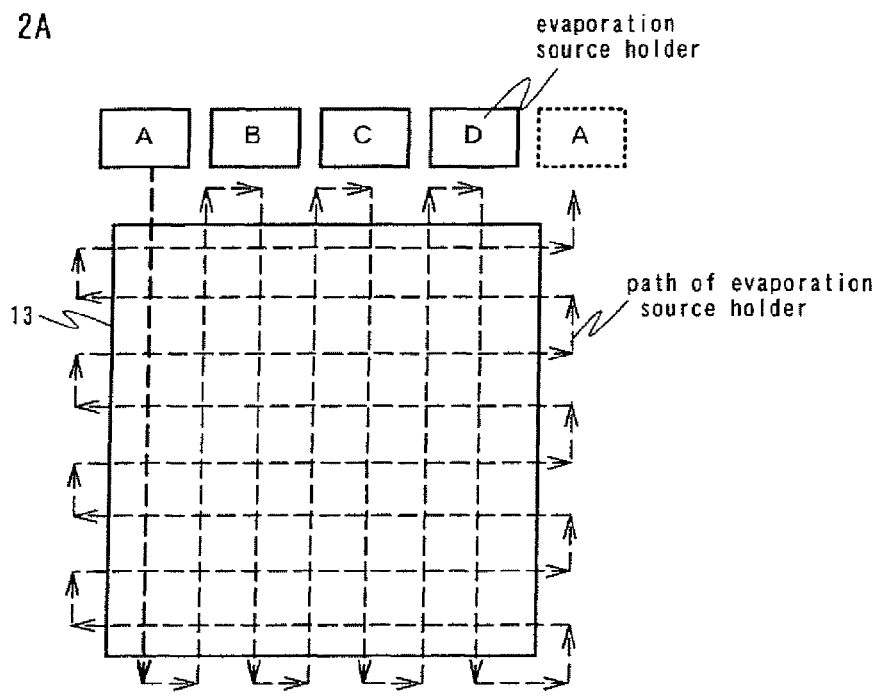

Further, the evaporation source holder 17 is provided with a mechanism movable in X direction or Y direction at inside of the deposition chamber 11 while maintaining a horizontal state. In this case, the evaporation source holder 17 is made to move in zigzag on a two-dimensional plane as shown by FIG. 2A or FIG. 2B. Further, a pitch of moving the evaporation source holder 17 may pertinently be matched to an interval between insulators. Further, insulators 10 are arranged in a stripe shape to cover end portions of first electrodes 21.

Further, it is not necessarily needed that an organic compound provided at the evaporation source holder is one or one kind thereof but may be a plurality of kinds thereof. For example, other than one kind of a material provided as a light emitting organic compound at the evaporation source holder, other organic compound which can be a dopant (dopant material) may be provided along therewith. It is preferable to design an organic compound layer to be vapor-deposited to constitute by a host material and a light emitting material (dopant material) having excitation energy lower than that of the host material such that the excitation energy of the dopant becomes lower than excitation energy of a hole transporting region and excitation energy of an electron transporting layer. Thereby, diffusion of a molecular exciter of the dopant can be prevented and the dopant can effectively be made to emit light. Further, when the dopant is a material of a carrier trap type, an efficiency of recombining carriers can also be promoted. Further, the invention includes a case in which a material capable of converting triplet excitation energy to luminescence is added to a mixing region as a dopant. Further, in forming the mixing region, a concentration gradient may be provided to the mixing region.

Further, when a plurality of organic compounds are provided at a single evaporation source holder, it is preferable for evaporating directions to be skew to intersect at a position of an object to be deposited such that the organic compounds are mixed together. Further, in order to carry out common evaporation, the evaporation source holder may be provided with four kinds of evaporation materials (for example, two kinds of host materials as evaporation material A, two kinds of dopant materials as evaporation material B). Further, when a pixel size is small (or, an interval between respective insulators is narrow), a film can finely be formed by dividing inside of a vessel in four and carrying out common evaporation for subjecting respectives pertinently to evaporation.

Further, since the interval distance d between the substrate 13 and the evaporation source holder 17 is narrowed to, representatively, 30 cm or smaller, preferably, 5 cm through 15 cm, there is a concern of heating also the evaporation mask 14. Therefore, it is preferable for the evaporation mask 14 to use a metal material having a low thermal expansion rate which is difficult to deform by heat (for example, a high melting point metal such as tungsten, tantalum, chromium, nickel or molybdenum or an alloy including these elements, a material such as stainless steel, inconel, Hastelloy). For example, a low thermal expansion alloy having 42% of nickel and 58% of iron or the like is pointed out. Further, in order to cool the evaporation mask to be heated, the evaporation mask may be provided with a mechanism of circulating a cooling medium (cooling water, cooling gas).

Further, in order to clean a deposited substance adhered to the mask, it is preferable to generate a plasma at inside of the deposition chamber by plasma generating means to vaporize the deposited substance adhered to the mask to vent the vapor to outside of the deposition chamber. For that purpose, a mask is separately provided with an electrode and a high frequency power source 20 is connected to either one of them. By the above-described, it is preferable that the mask is formed by a conductive material.

Further, the evaporation mask 14 is used when an evaporation film is selectively formed on a first electrode 21 (cathode or anode) and the evaporation mask 14 is not particularly needed when the evaporation film is formed over an entire face thereof.

Further, the deposition chamber includes gas introducing means for introducing one kind or a plurality of kinds of gases selected from the group consisting of Ar, H, F, $NF_3$, and O and venting means for venting the deposited substance vaporized. By the above-described constitution, inside of the deposition chamber can be cleaned without being in contact with the atmosphere in maintenance.

Cleaning can be performed as follows, the atmosphere in a chamber is substituted by nitrogen, and is vacuum exhausted, and a high frequency power supply (13.56 MHz) can be connected with either the mask or the electrode so that a plasma is generated therebetween (substrate shutter, not illustrated). And, argon and hydrogen are introduced to the chamber in respective flow rate of 30 sccm, and the atmosphere in the chamber are stabilized, an RF electric power of 800 W is applied to generate plasma, thereby the mask and inner wall of the chamber can be cleaned.

Further, the deposition chamber 11 is connected with a vacuuming chamber for vacuuming inside of the deposition chamber. The vacuum processing chamber is provided with a turbo-molecular pump of a magnetic levitation type, a cryopump or a dry pump. Thereby, the ultimate vacuum degree of the deposition chamber 11 can be made to be $10^{-5}$ through $10^{-6}$ Pa and inverse diffusion of an impurity from a pump side and an venting system can be controlled. In order to prevent an impurity from being introduced into the deposition chamber 11, as a gas to be introduced, an inert gas of nitrogen or rare gas is used. There are used the gases to be introduced which are highly purified by a gas refiner before being introduced into the device. Therefore, it is necessary to provide the gas refiner such that the gas is highly purified and thereafter introduced into the deposition chamber 11. Thereby, an impurity of oxygen, water or the like included in the gas can previously be removed and therefore, the impurities can be prevented from being introduced into the deposition chamber 11.

Further, the substrate holder 12 is provided with a permanent magnet for fixing the evaporation mask comprising a metal with the magnetic force and also fixing the substrate 13 interposed therebetween. Although an example of bringing the evaporation mask into close contact with the substrate 13 is shown here, a substrate holder or an evaporation mask holder fixed with an interval to some degree therebetween may pertinently be provided.

According to the deposition chamber having the mechanism of moving the evaporation source holder as described above, it is not necessary to prolong the distance between the substrate and the evaporation source holder and the evaporation film can uniformly be formed.

Therefore, according to the invention, the distance between the substrate and the evaporation source holder can be shortened and small-sized formation of the evaporation device can be achieved. Further, since the evaporation device becomes small-sized, adherence of the sublimated evaporation material to the inner wall or the adherence preventive shield at inside of the deposition chamber can be reduced and the evaporation material can effectively be utilized. Further, according to the evaporation method of the invention, it is not necessary to rotate the substrate and therefore, the evaporation device capable of dealing with a large area substrate can be provided.

Further, by shortening the distance between the substrate and the evaporation source holder in this way, the evaporation film can be deposited thinly and controllably.

Embodiment 2

A detailed description will be given of constitutions of a vessel for filling an evaporation material and an evaporation source holder at a surrounding thereof according to the invention in reference to FIGS. 3A and 3B as follows. Further, FIGS. 3A and 3B show a state of opening a shutter.

Figure 3A:
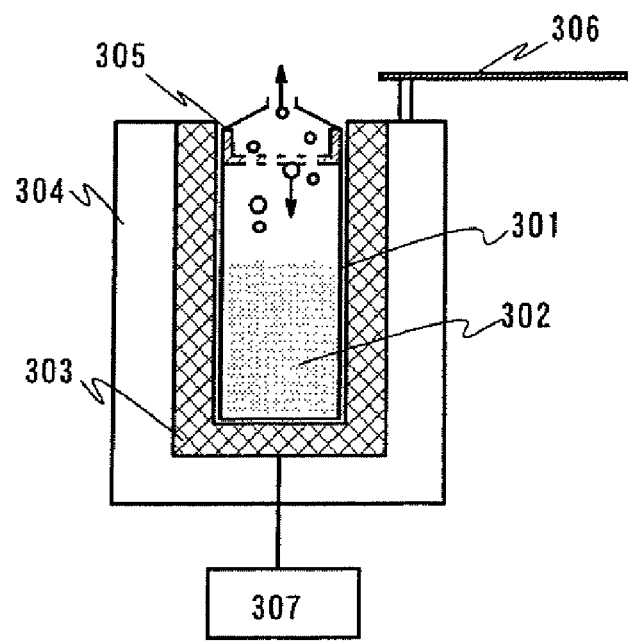
FIGS. 3A and 3B are views showing a vessel according to the invention.
Figure 3B:
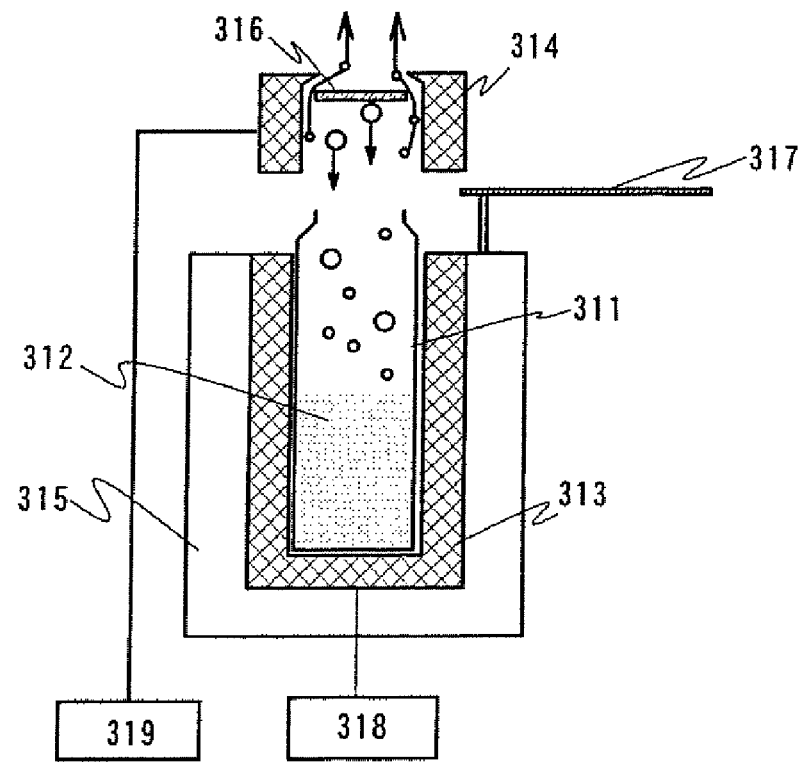

FIG. 3A shows a sectional view of a surrounding of one vessel installed at an evaporation source holder 304 illustrated with heating means 303 provided at the evaporation source holder, a power source 307 of the heating means, an evaporation material 302 of the vessel, a filter 305 provided at inside of the vessel and a shutter 306 arranged above an opening portion provided at an upper portion of the vessel. As the heating means 303, resistance heating, high frequency or laser may be used, specifically, an electric coil may be used.

Further, the evaporation material 302 heated by the heating means 303 is sublimated and the sublimated material 302 rises upwardly from the opening portion of the vessel. At this occasion, the sublimated material having a size equal to or larger than a certain constant amount (mesh of filter) cannot pass the filter 305 provided at inside of the vessel, returns into the vessel and is sublimated again. Further, the filter 305 may be formed by a highly conductive material and heated by heating means (not illustrated). By the heating, the evaporation material can be prevented from being solidified and adhered to the filter.

By the vessel having the constitution provided with such a filter, the evaporation material having an even size is vapor-deposited and therefore, a deposition rate can be controlled and a uniform film thickness can be provided and uniform evaporation without nonuniformity can be carried out. Naturally, when uniform evaporation without nonuniformity can be carried out, it is not necessarily needed to provide a filter. Further, a shape of the vessel is not limited to that in FIG. 3A.

Next, an explanation will be given of a vessel filled with an evaporation material having a constitution different from that of FIG. 3A in reference to FIG. 3B.

FIG. 3B is illustrated with a vessel 311 installed at an evaporation holder, an evaporation material 312 at inside of the vessel, first heating means 313 provided at the evaporation source holder, a power source 318 of the first heating means, a shutter 317 arranged above an opening portion of the vessel, a plate 316 provided above the opening portion, second heating means 314 provided to surround the filter and a power source 319 of second heating means.

Further, the evaporation material 312 heated by the first heating means 313 is sublimated and the sublimated evaporation material rises upwardly from the opening portion of the vessel 311. At this occasion, the sublimated material having a size equal to or larger than a certain constant amount cannot pass an interval between the plate 316 provided above the opening portion of the vessel and the second heating means 314, impinges on the plate 316 and returns to inside of the vessel. Further, since the plate 316 is heated by the second heating means 314, the evaporation material can be prevented from solidifying and adhering to the plate 316. Further, it is preferable to form the plate 316 by a highly conductive material. Further, a filter may be provided in place of the plate.

Further, heating temperature ($T_1$) by the first heating means 313 is higher than sublimating temperature ($T_A$) of the evaporation material, a heating temperature ($T_2$) by the second heating means 314 may be lower than that of the first heating means. This is because once sublimated evaporation material is easy to sublimate and therefore, the evaporation material is sublimated without applying the actual sublimating temperature. That is, respective heating temperatures may establish $T_1 \gg T_2 > T_A$.

By such a vessel having a constitution of providing the heating means around the plate, the evaporation material having an even size is sublimated, further, the sublimated material passes a vicinity of the heating means and therefore, adherence of the evaporation material to the plate is reduced, further, the deposition rate can be controlled and therefore a uniform film thickness can be provided and uniform evaporation without nonuniformity can be carried out. Naturally, when the uniform evaporation without nonuniformity can be carried out, it is not necessarily needed to provide the plate. Further, the shape of the vessel is not limited to those in FIGS. 3A and 3B but, for example, the vessel may be provided with shapes as shown by FIGS. 4A and 4B.

Figure 4A:
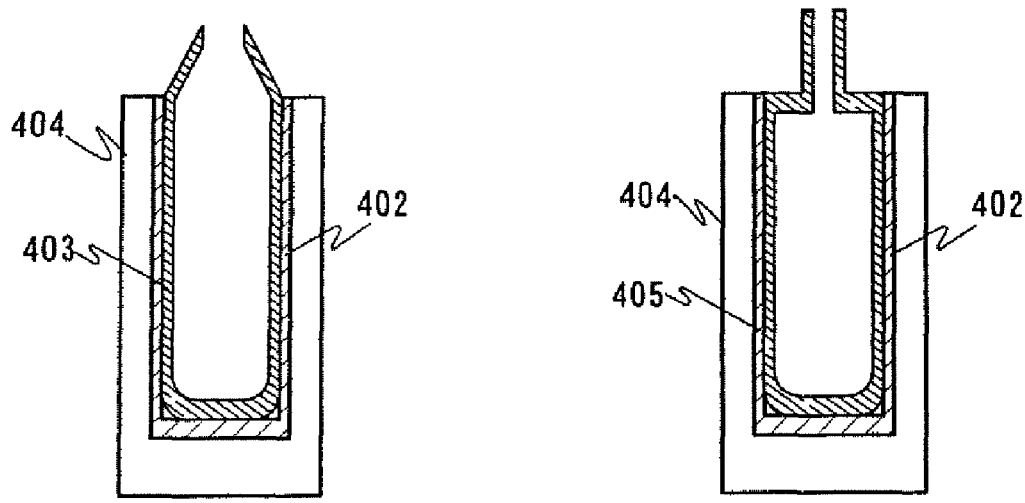
FIGS. 4A and 4B are views showing a vessel according to the invention.

FIG. 4A shows an example of providing heating means 402 at an evaporation source holder 404 illustrating sectional views of examples of shapes of vessels 403 and 405 in each of which an opening portion of the vessel is narrowed toward an upper side thereof. Further, after filling a refined evaporation material in a vessel having a wide opening portion, the shapes of the vessel 403 or 405 shown in FIG. 4A may be constituted by using a lid or the like. Further, when a diameter of the opening portion of the vessel narrowed toward the upper side is constituted by the size of the evaporation material intended to form, an effect similar to that of a filter can be achieved.

Figure 4B:
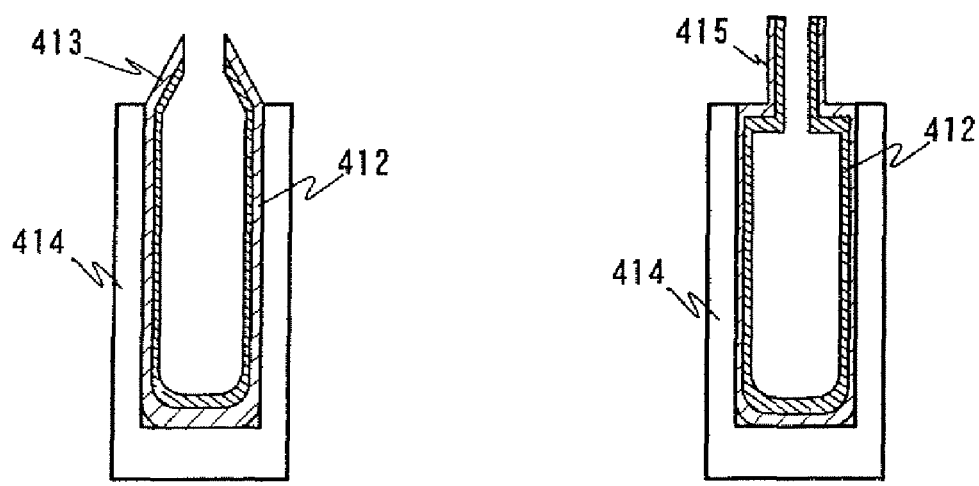

Further, FIG. 4B shows examples of providing heating means 412 at vessels. Although shapes of the vessels 413 and 415 are similar to those of FIG. 4A, the heating means 412 are provided at the vessels per se. Further, power sources of the heating means may be designed to be brought into an ON state at a stage of being installed to evaporation source holders. By such a constitution of providing the heating means at the vessel per se, heat can be applied sufficiently to an evaporation material even in the case of a vessel having an opening portion in a shape which is difficult to heat.

Figure 5A:
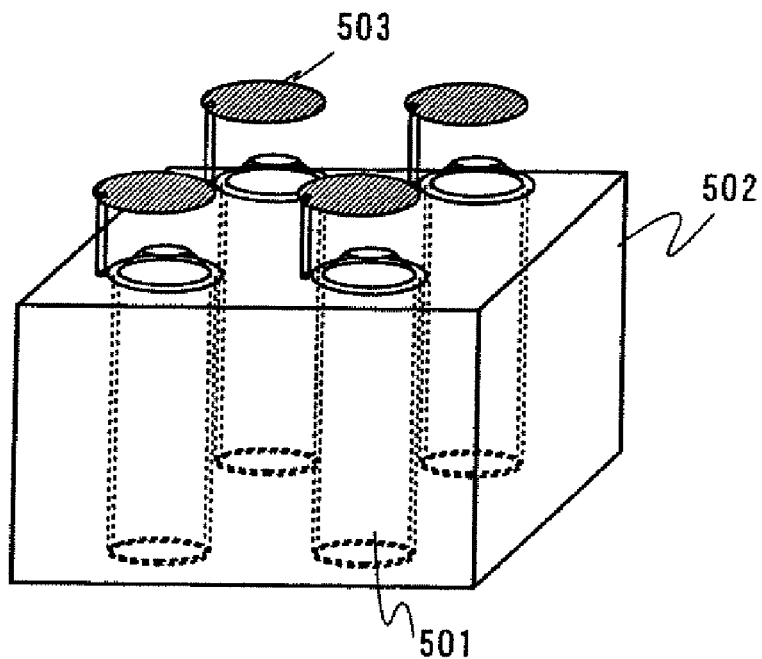
FIGS. 5A and 5B are views showing an evaporation source holder according to the invention.
Figure 5B:
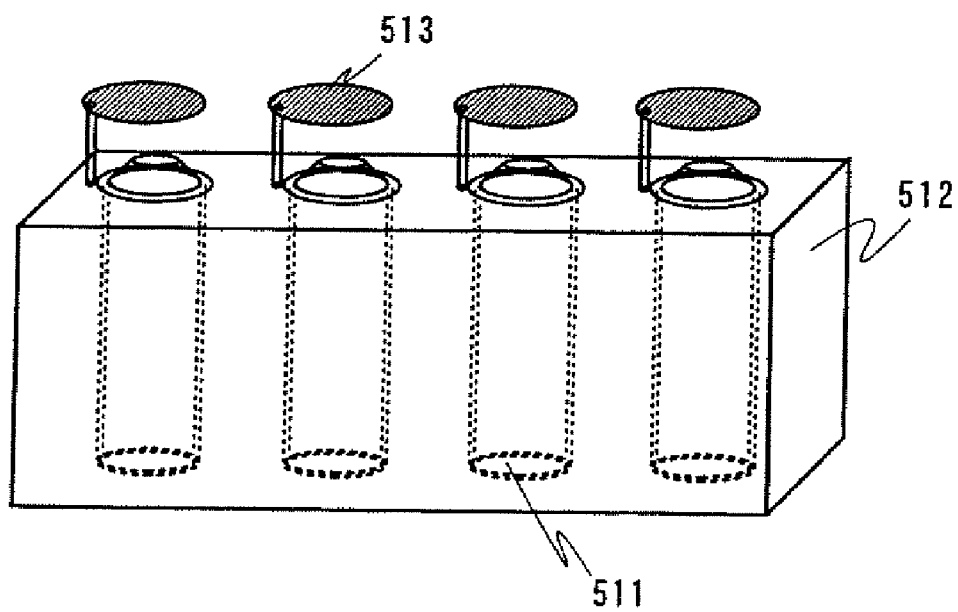

Next, a specific constitution of an evaporation source holder will be explained in reference to FIGS. 5A and 5B. FIGS. 5A and 5B show enlarged views of evaporation source holders.

FIG. 5A shows a constitution example of providing four vessels 501 filled with an evaporation material to an evaporation source holder 502 in a shape of a lattice and providing shutters 503 above the respective vessels and FIG. 5B shows a constitution example of providing four vessels 511 filled with an evaporation material to an evaporation source holder 512 in a linear shape and providing shutters 513 above the respective vessels.

A plurality of the vessels 501 or 511 filled with the same material may be installed at the evaporation source holder 502 or 512 illustrated in FIG. 5A or 5B or a single one of the vessel may be installed at the evaporation source holder. Further, common evaporation may be carried out by installing vessels filled with different evaporation materials (for example, host material and guest material). Further, as described above, the evaporation material is sublimated by heating the vessel and a film is formed at the substrate.

Further, as shown by FIG. 5A or 5B, it may be controlled whether the film is formed by the sublimated evaporation material by providing the shutter 503 or 513 above each vessel. Further, only a single one of the shutter may be provided above all of the vessels. Further, by the shutter, it can be reduced to sublimate and scatter an unnecessary evaporation material without stopping to heat the evaporation source holder which does not form the film, that is, the evaporation source holder being at standby. Further, the constitution of the evaporation source holder is not limited to those of FIGS. 5A and 5B but may pertinently be designed by a person for embodying the invention.

By the above-described evaporation source holder and vessel, the evaporation material can efficiently be sublimated, further, the film is formed in a state in which the size of the evaporation material is even and therefore, a uniform evaporation film without nonuniformity is formed. Further, a plurality of evaporation materials can be installed at the evaporation source holder and therefore, common evaporation can easily be carried out. Further, an aimed EL layer can be formed in one operation without moving the deposition chamber for each film of the EL layer.

Embodiment 3

An explanation will be given, with reference to FIG. 6, of a device of a fabricating method of filling a refined evaporation material in the above-described vessel, carrying the vessel and thereafter installing the vessel directly at an evaporation device which is a deposition device, to carry out evaporation.

Figure 6:
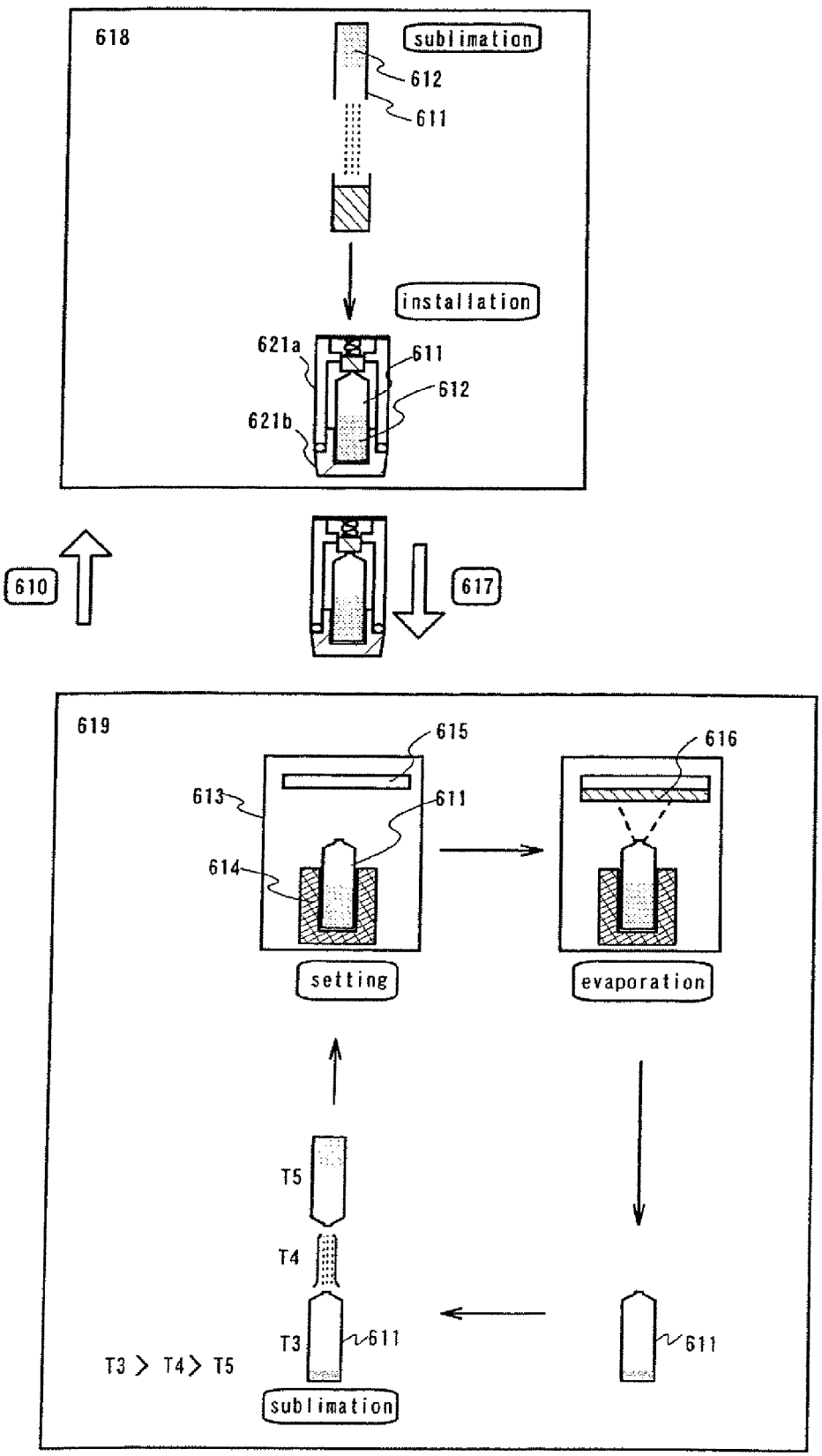
FIG. 6 is a view showing a fabricating device according to the invention.

FIG. 6 illustrates a maker, representatively, a material maker 618 (representatively, material maker) for producing and refining an organic compound material which is an evaporation material and a maker (representatively, production factory) 619 of a light emitting device which is a maker of a light emitting device having an evaporation device.

First, an order 610 is carried out from the light emitting device maker 619 to the material maker 618. Based on the order 610, the material maker 618 refines to sublimate an evaporation material and fills an evaporation material 612 in a shape of a powder refined in high purity to a first vessel (representatively, crucible) 611. Thereafter, the material maker 618 isolates the first vessel from the atmosphere such that an extra impurity is not adhered to inside or outside thereof, and contains the first vessel 611 in second vessels 621a and 621b to hermetically seal for preventing the first vessel 611 from being contaminated at inside of the clean environment chamber. In hermetically sealing the second vessels 621a and 621b, at inside of the vessels it is preferable to be vacuum or to be filled with an inert gas of nitrogen or the like. Further, it is preferable to clean the first vessel 611 and the second vessels 621a and 621b before refining or containing the evaporation material 612 with an ultra high purity. Further, although the second vessels 621a and 621b may be package films having barrier performance for blocking oxygen or moisture from mixing thereinto, in order to be able to take out the vessels automatically, it is preferable that the second vessels are constituted by stout vessels having light blocking performance in a shape of a cylinder or a shape of a box.

Thereafter, the first vessel 611 is carried (617) from the material maker 618 to the light emitting device maker 619 in a state of being hermetically sealed by the second vessels 621a and 621b.

At the light emitting device maker 619, the first vessel 611 is directly introduced into a vacuumable processing chamber 613 in a state of being hermetically sealed in the second vessels 621a and 621b. Further, the processing chamber 613 is an evaporation device installed with heating means 614 and substrate holding means (not illustrated) at inside thereof.

Thereafter, inside of the processing chamber 613 is vacuumed to bring about a clean state in which oxygen or moisture is reduced as less as possible, thereafter, without breaking the vacuum, the first vessel 611 is taken out from the second vessels 621a and 621b, the first vessel 611 is installed in contact with the heating means 614 and an evaporation source can be prepared. Further, an object to be deposited (here, substrate) 615 is installed at the processing chamber 613 to be opposed to the first vessel 611.

Successively, an evaporation film 616 is formed on a surface of the object to be deposited 615 by applying heat to the evaporation material by the heating means 614. The evaporation film 616 provided in this way does not include an impurity and when a light emitting escent element is finished by using the evaporation film 616, high reliability and high brightness can be realized.

Further, after forming the film, the evaporation material remaining at the first vessel 611 may be sublimated to refine at the light emitting device maker 619. After forming the film, the first vessel 611 is installed at the second vessels 621a and 621b, taken out from the processing chamber 613 and carried to a refining chamber for sublimating to refine the evaporation material. There, the remaining evaporation material is sublimated to refine and the evaporation material in a shape of a powder refined at high purity is filled into a separate vessel. Thereafter, in a state of being hermetically sealed in the second vessel, the evaporation material is carried to the processing chamber 613 to carry out evaporation processing. At this occasion, it is preferable that a relationship among temperature (T3) for refining the remaining evaporation material, temperature (T4) elevated at a surrounding of the evaporation material and temperature (T5) at a surrounding of the evaporation material which is sublimated to refine satisfy T3>T4>T5. That is, in the case of sublimating to refine the material, when temperature is lowered toward a side of the vessel for filling the evaporation material to be sublimated to refine, convection is brought about and the deposition material can be sublimated to refine efficiently. Further, the refining chamber for sublimating to refine the evaporation material may be provided in contact with the processing chamber 613 and the evaporation material which has been sublimated to refine may be carried without using the second vessel for hermetically sealing the evaporation material.

As described above, the first vessel 611 is installed in the evaporation chamber which is the processing chamber 613 without being brought into contact with the atmosphere at all to enable to carry out evaporation while maintaining the purity at the stage of containing the evaporation material 612 by the material maker. Therefore, according to the invention, a fully automated fabricating system promoting the throughput can be realized and an integrated closed system capable of avoiding the impurity from mixing to the evaporation material 612 refined at the material maker 618 can be realized. Further, the evaporation material 612 is directly contained in the first vessel 611 by the material mater based on the order and therefore, only a necessary amount thereof is provided to the light emitting device maker and the comparatively expensive evaporation material can efficiently be used. Further, the first vessel and the second vessel can be reutilized to amount to a reduction in cost.

Figure 7:
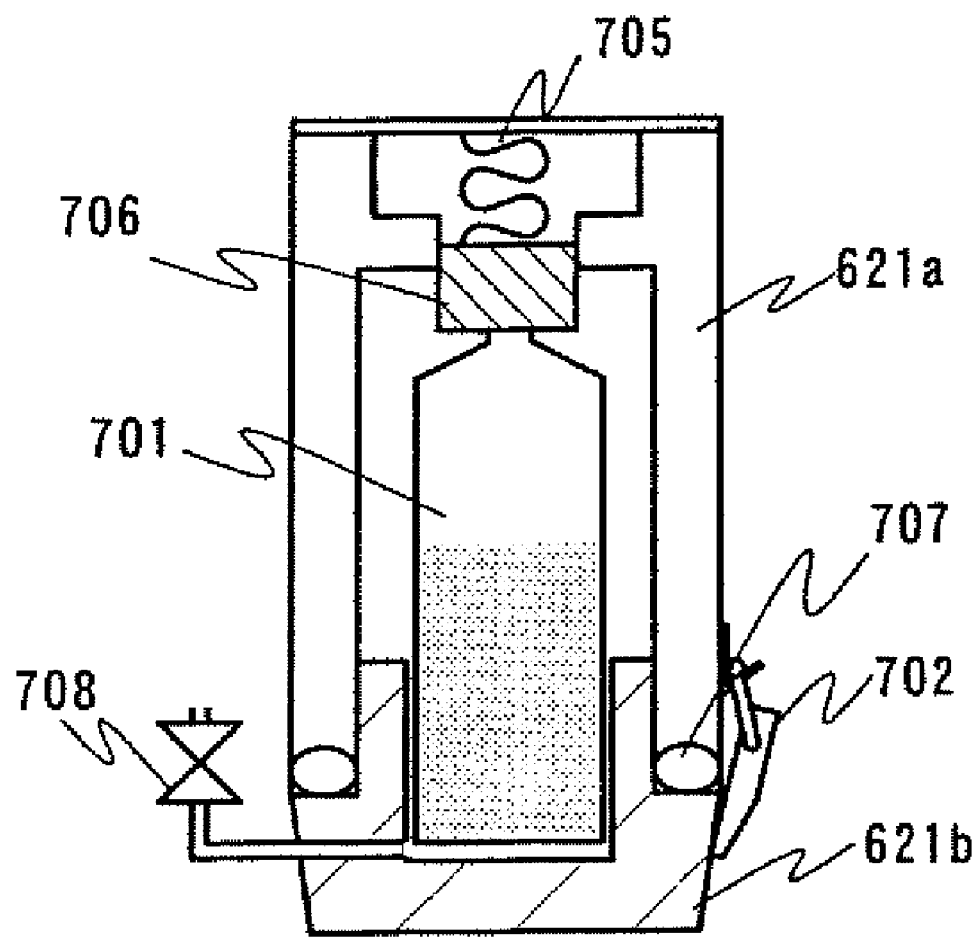
FIG. 7 is a view showing a carrier vessel according to the invention.

A specific explanation will be given of a mode of the vessel to be carried in reference to FIG. 7 as follows. A second vessel divided into an upper portion (621a) and a lower portion (621b) used for transportation includes fixing means 706 provided at an upper portion of the second vessel for fixing a first vessel, a spring 705 for pressing the fixing means, a gas introducing port 708 provided at a lower portion of the second vessel for constituting a gas path for maintaining the second vessel being depressurized, an O ring 707 for fixing the upper vessel 621a and the lower vessel 621b and a retaining piece 702. The first vessel 611 filled with the refined evaporation material is installed in the second vessel. Further, the second vessel may be formed by a material including stainless steel and the first vessel may be formed by a material including titanium.

At the material maker, the refined evaporation material is filled in the first vessel 611. Further, the upper portion 621a and the lower portion 621b of the second vessel are matched via the O ring 707, the upper vessel 621a and the lower vessel 621b are fixed by the retaining piece 702, and the first vessel 611 is hermetically sealed at inside of the second vessel. Thereafter, inside of the second vessel is depressurized via the gas introducing port 708 and is replaced by a nitrogen atmosphere and the first vessel 611 is fixed by the fixing means 706 by adjusting the spring 705. A desiccant may be installed at inside of the second vessel. When inside of the second vessel is maintained in vacuum, in a low pressure or in nitrogen atmosphere in this way, even a small amount of oxygen or water can be prevented from adhering to the evaporation material.

The first vessel 611 is carried to the light emitting device maker 619 under the state and is directly installed to the processing chamber 613. Thereafter, the evaporation material is sublimated by heating and the evaporation film 616 is formed.

Next, an explanation will be given of a mechanism of installing the first vessel 611 which is carried by being hermetically sealed in the second vessel to a deposition chamber 806 in reference to FIGS. 8A and 8B and FIGS. 9A and 9B. Further, FIGS. 8A and 8B and FIGS. 9A and 9B show the first vessel in the midst of transportation.

Figure 8A:
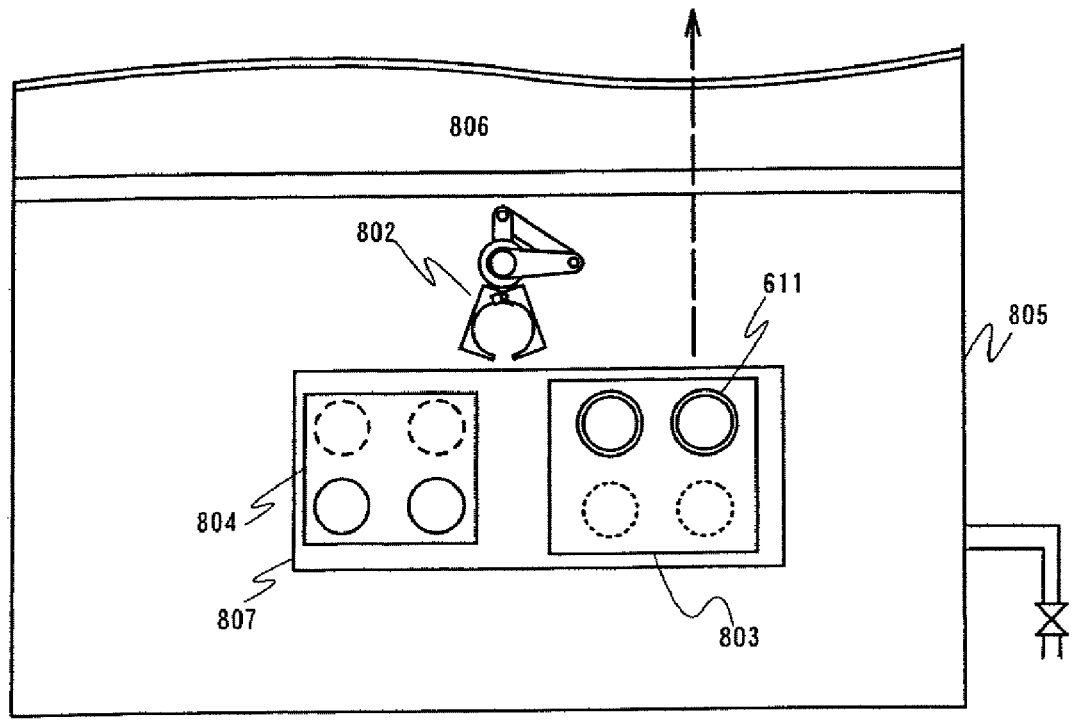
FIGS. 8A and 8B are views showing an evaporation device according to the invention.
Figure 8B:
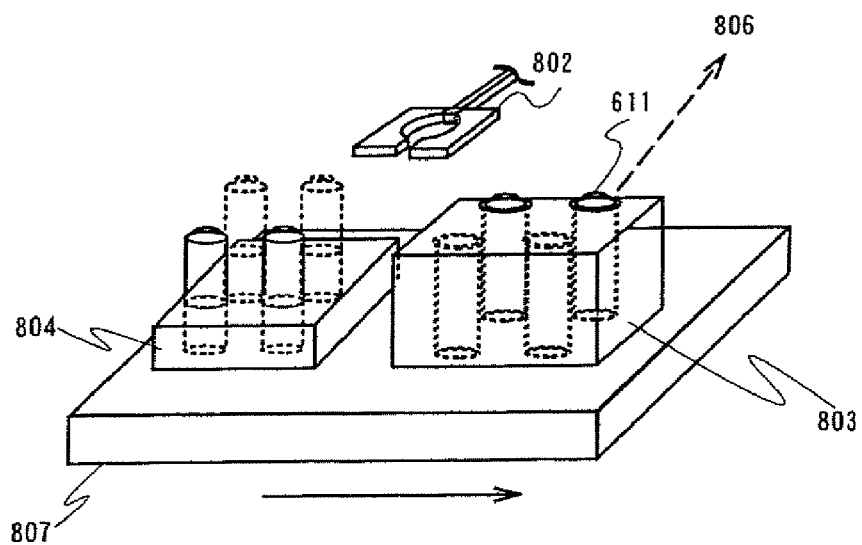

FIG. 8A illustrates to a top view of an installing chamber 805 including a base 804 for mounting the first vessel or the second vessel, an evaporation source holder 803, means 807 for mounting the base 804 and the evaporation source holder 803 to move and carrying means 802 for carrying the first vessel, and FIG. 8B illustrates a perspective view of the installing chamber. Further, the installing chamber 805 is arranged to be contiguous to the deposition chamber 806 and the atmosphere of the installing chamber can be controlled by means for controlling the atmosphere via a gas introducing port. Further, the carrying means of the invention is not limited to a constitution of pinching a side face of the first vessel to carry as illustrated in FIGS. 8A and 8B but may be constructed by a constitution of pinching (picking) the first vessel at upper part thereof to carry.

The second vessel is arranged to such an installing chamber 805 above the base 804 in a state of disengaging the retaining piece 702. Successively, inside of the installing chamber 805 is brought into a decompressed state by means for controlling the atmosphere. When pressure at inside of the installing chamber and pressure at inside of the second vessel become equal to each other, there is brought about a state of being capable of opening the second vessel easily. Further, the upper portion 621*a* of the second vessel is removed and the first vessel 611 is installed in the evaporation source holder 803 by the carrying means 802. Further, although not illustrated, a portion for installing the removed upper portion 621*a* is pertinently provided. Further, the moving means 807 is moved (slid) and the evaporation source holder 803 is moved from the installing chamber 805 to the deposition chamber 806.

Thereafter, by heating means provided at the evaporation source holder 803, the evaporation material is sublimated and the film starts to be formed. In forming the film, when a shutter (not illustrated) provided at the evaporation source holder 803 is opened, the sublimated evaporation material is scattered to the direction of the substrate and the vapor-deposited onto the substrate to form the light emitting layer (including hole transporting layer, hole injecting layer, electron transporting layer and electron injecting layer).

Further, after finishing evaporation, the evaporation source holder 803 returns to the installing chamber 805 and the first vessel 611 installed at the evaporation source holder 803 by the carrying means 802 is transferred to the lower vessel (not illustrated) of the second vessel installed at the base 804 and is hermetically sealed by the upper vessel 621*a*. At this occasion, it is preferable that the first vessel, the upper vessel 621*a* and the lower vessel are hermetically sealed by a combination by which the vessels have been carried. Under the state, the installing chamber 805 is brought under the atmospheric pressure and the second vessel is taken out from the installing chamber, fixed with the retaining piece 702 and is carried to the material maker 618.

Further, in order to carry the evaporation source holder for starting evaporation and the evaporation source holder finished with evaporation efficiently, the moving means 807 may be provided with a rotating function. Further, the carrying means 802 may include arms of a number of the first vessels installed at the evaporation source holder and a plurality of the carrying means 802 may be provided.

Further, in place of the moving means 807, a rotating base (rotating base 820) can be arranged between the base 804 and the evaporation source holder 803 to efficiently enable to install the first vessel before starting the evaporation to the evaporation source holder and install the first vessel finished with evaporation to the second vessel.

Figure 17A:
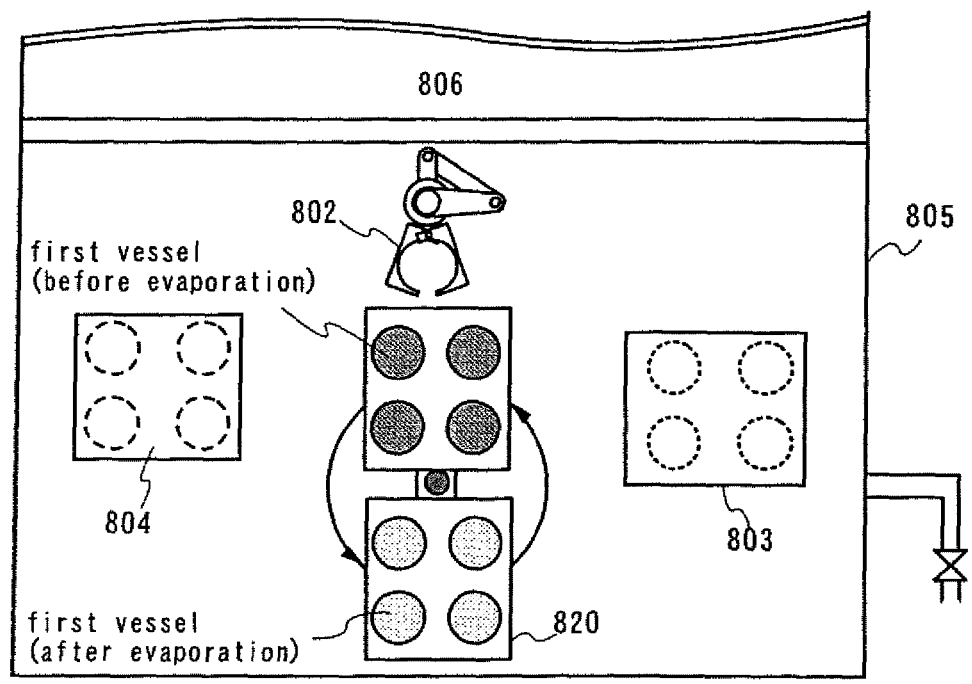
FIGS. 17A and 17B are views showing an evaporation device according to the invention.

Explaining a method of efficiently carrying out the operation in reference to FIG. 17A, when a preceding one of the evaporation source holder 803 is subjected to evaporation, as described above, a succeeding one of the first vessel is installed at the base 804 and successively, installed to one side of the rotating base 820 by carrying means. Further, the rotating base 820 is rotated by 180 degrees. Thereafter, the first vessel of the evaporation source holder 803 finished with evaporation is removed from the evaporation source holder 803 and installed to other side of the rotating base 820 by the carrying means 802. Further, the rotating base 820 is rotated by 180 degrees. Further, a succeeding one of the first vessel to be installed to the one side of the rotating base 820 is installed to the evaporation source holder 803 by the carrying means and the evaporation source holder is moved to the deposition chamber. Thereafter, the first vessel installed on the other side of the rotating base 820 is installed to the base 804 by the carrying means 802, hermetically sealed by the second vessel and taken out from the installing chamber 805. By such a constitution, installation of the first vessel before starting evaporation to the evaporation holder and installation of the first vessel after finished with the evaporation can efficiently be carried out.

Further, the carrying means 802 may include a mechanism of pinching the side face of the first vessel or a function including a mechanism of pinching an upper face thereof, that is, a lid. Further, the rotating base may be provided with heating means for previously heating the material at inside of the evaporation source holder. Further, maintenance for interchanging a quartz oscillator installed at the evaporation source holder or the like may be carried out at the installing chamber.

Figure 17B:
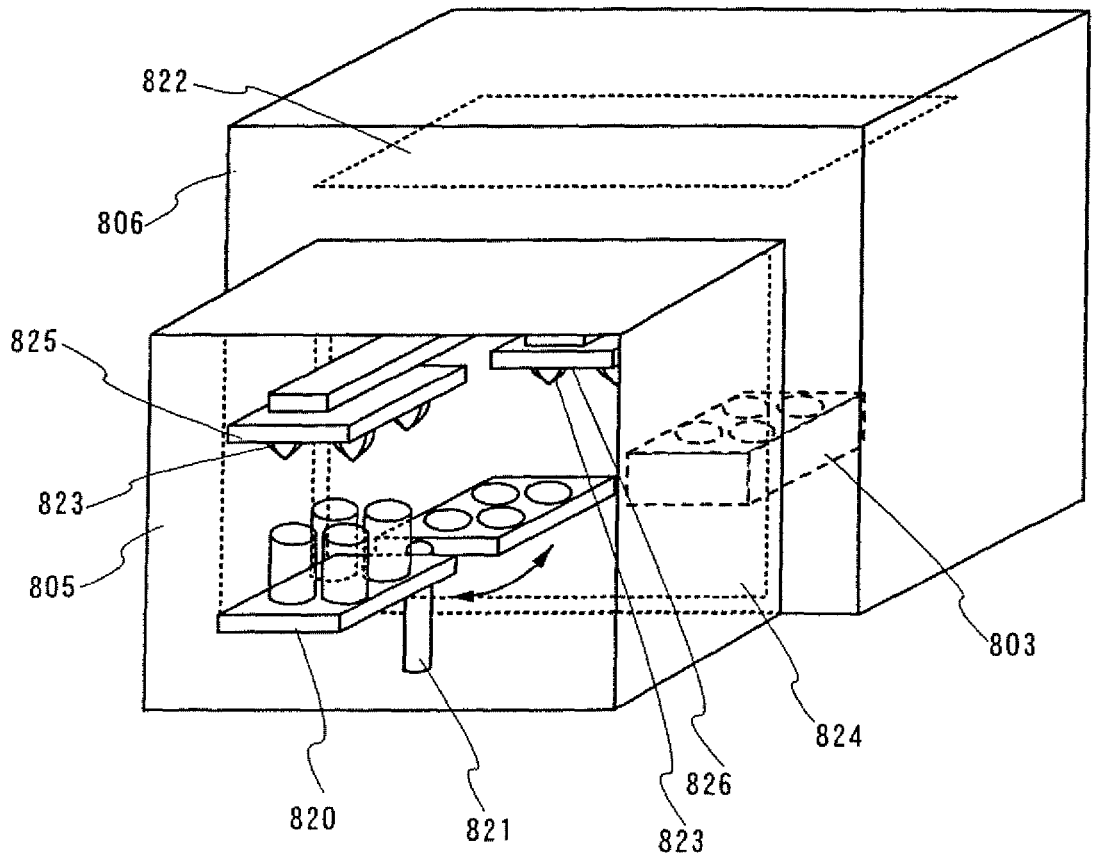

A perspective view of FIG. 17B explains a case in which the first vessel before evaporation and the first vessel after evaporation are interchanged by a method different from that of FIG. 17A.

The installing chamber 805 shown in FIG. 17B is characterized in including first carrying means 825 for opening the lid of the second vessel and second carrying means 826 for taking out the first vessel from the second vessel and installing the first vessel to the evaporation source holder. The first and the second carrying means respectively include pinchers 823.

First, the lid of the second vessel fixed to the rotating base is opened and the rotating base 820 is rotated by a half by a rotating shaft 821. Further, by using the second carrying means, the first vessel is taken out from the second vessel the lid of which is opened, and carried to the evaporation source holder installed at the deposition chamber 806 by opening an opening/closing window 824 to be installed. When the opening/closing window is opened, the installing chamber and the deposition chamber are brought into a state of being maintained at a decompressed state to the same degree to prevent contamination of the deposition chamber by an impurity. Further, after closing the opening/closing window, the evaporation source holder 803 is moved and the evaporation to a substrate 822 installed at the deposition chamber is started.

During a time period in which evaporation is being carried out in the deposition chamber 806, the installing chamber is opened to the atmospheric pressure, the second vessel filled with new one of the evaporation material is installed at the rotating base 820 and the installing chamber is brought into the decompressed state again. At this occasion, a vacant portion of the rotating base may be disposed on this side by the rotating shaft.

Thereafter, the first vessel finished with evaporation is returned to the second vessel of the rotating base by using the second carrying means 826 and the lid pinched by the first carrying means 825 is closed. Successively, by the first carrying means, the lid of a new one of the second vessel is opened, the first vessel is taken out by the second carrying means 826 and installed at the evaporation source holder. Further, during a time period in which evaporation is being carried out at the deposition chamber, the installing chamber is brought into the atmospheric pressure, the first and the second vessels which have been used are taken out and new ones of the first and the second vessels are installed.

As described above, the first and the second vessels can be interchanged without exposing the first vessel filled with the material to the atmosphere and efficiently.

Next, an explanation will be given of a mechanism of installing a plurality of first vessels carried by being hermetically sealed by the second vessels to a plurality of the evaporation source holders, which is different from those of FIGS. 8A and 8B and FIGS. 17A and 17B in reference to FIGS. 9A and 9B.

Figure 9A:
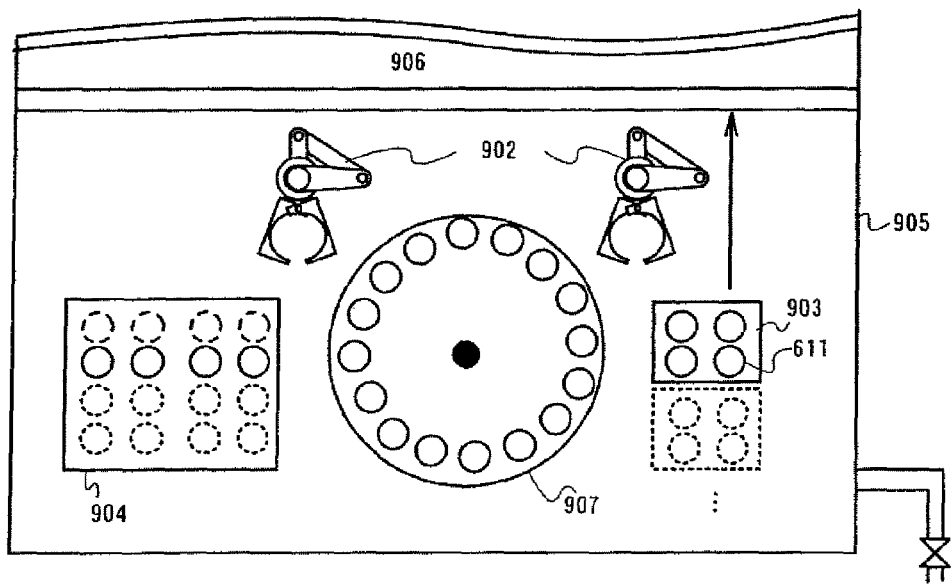
FIGS. 9A and 9B are views showing an evaporation device according to the invention.
Figure 9B:
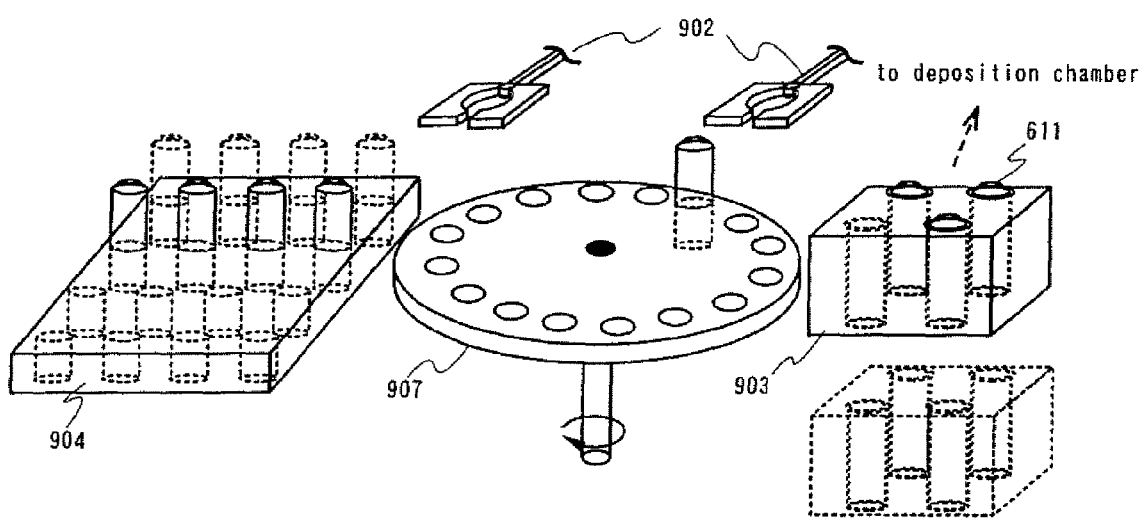

FIG. 9A illustrates a top view of an installing chamber 905 including a base 904 for mounting the first vessel or the second vessel, a plurality of evaporation source holders 903, a plurality of carrying means 902 for carrying the first vessels and a rotating base 907 and FIG. 9B illustrates a perspective view of the installing chamber 905. Further, the installing chamber 905 is arranged to be contiguous to a deposition chamber 906 and the atmosphere of the installing chamber can be controlled by means for controlling the atmosphere via a gas introducing port.

By the rotating base 907 and the plurality of carrying means 902, operation of installing the plurality of first vessels 611 to the plurality of evaporation source holders 905 and transferring the plurality of first vessels 611 from the plurality of evaporation source holders finished with film formation to the base 904 can efficiently be carried out. At this occasion, it is preferable to install the first vessel 611 to the second vessel which has been carried.

According to an evaporation film formed by the above-described evaporation device, an impurity can be reduced to an extreme and when a light emitting element is finished by using the evaporation film, high reliability and brightness can be realized. Further, by such a fabricating system, the vessel filled by the material maker can be installed directly to the evaporation device and therefore, oxygen or water can be prevented from adhering to the evaporation material and further ultrahigh purity formation of the light emitting element in the future can be dealt with. Further, by refining the vessel having the remaining evaporation material again, waste of the material can be eliminated. Further, the first vessel and the second vessel can be reutilized and the low cost formation can be realized.

EXAMPLES

Examples of the present invention is described thereinafter based on the drawings. In addition, in all drawings used for the description of the examples, same portions are given common symbols, and the repetitive descriptions thereof are omitted.

Example 1

In this example, an example of forming TFT on a substrate having an insulating surface and forming an EL element (light emitting element) is shown in FIG. 10. A cross-sectional view of one TFT that is connected to an EL element in a pixel portion is shown in this example.

Figure 10A:
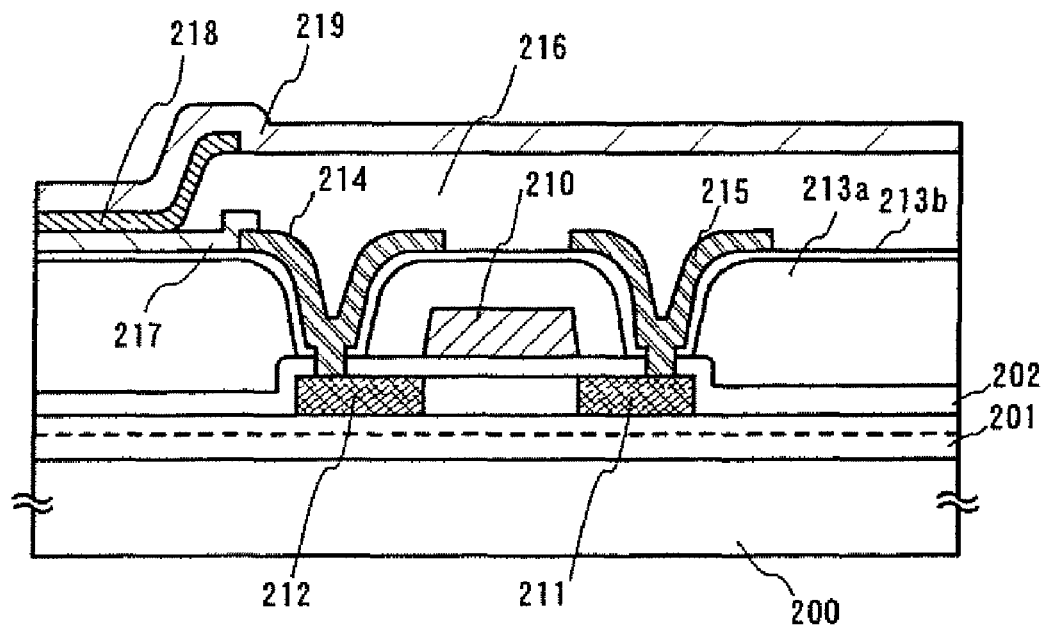
FIGS. 10A and 10B are views showing a light emitting device according to the invention.

As shown in FIG. 10A, a base insulating film 201 is formed by a lamination of insulating films such as a silicon oxide film, a silicon nitride film or a silicon oxide nitride film on a substrate 200 having an insulating surface. Although the base insulating film 201 herein uses a two-layer structure, it may use a structure having a single layer or two layers or more of the insulating films. The first layer of the base insulating film is a silicon oxide nitride film formed to have a thickness of 10 to 200 nm (preferably 50 to 100 nm) by a plasma CVD using a reaction gas of $SiH_4$, $NH_3$ and $N_2O$. Herein, a silicon oxide nitride film is formed (composition ratio: Si=32%, O=27%, N=24% and H=17%) having a film thickness of 50 nm. The second layer of the base insulating film is a silicon oxide nitride film formed to have a thickness 50 to 200 nm (preferably 100 to 150 nm) by a plasma CVD using a reaction gas of $SiH_4$ and $N_2O$. Herein, a silicon oxide nitride film is formed (composition ratio: Si=32%, O=59%, N=7% and H=2%) having a film thickness of 100 nm.

Subsequently, a semiconductor layer is formed on the base insulating film 201. The semiconductor layer is formed as follows: an amorphous semiconductor film is formed by known means (a sputtering, an LPCVD, a plasma CVD, or the like), then, the film is crystallized by a known crystallization method (a laser crystallization method, a thermal crystallization method or a thermal crystallization method using a catalyst such as nickel), and then, the crystalline semiconductor film is patterned into a desired form. This semiconductor layer is formed in a thickness of 25 to 80 nm (preferably 30 to 60 nm). The material of the crystalline semiconductor film, although not limited in material, is preferably formed of silicon or a silicon-germanium alloy.

In the case of forming a crystalline semiconductor film by a laser crystallizing process, it is possible to use an excimer laser of a pulse-oscillation or continuous-oscillation type, a YAG laser, or an $YVO_4$ laser. In the case of using such laser, preferably used is a method that the laser light emitted from a laser oscillator is condensed by an optical system into a linear form to be irradiated onto the semiconductor film. The condition of crystallization is to be appropriately selected by those who implement the invention. In the case of using an excimer laser, pulse oscillation frequency is 30 Hz and laser energy density is 100 to 400 mJ/cm$^2$ (typically 200 to 300 mJ/cm$^2$). Meanwhile, in the case of using a YAG laser, preferably its second harmonic is used and pulse oscillation frequency is 1 to 10 kHz and laser energy density is 300 to 600 mJ/cm$^2$ (typically 350 to 500 mJ/cm$^2$). The laser light focused linear to a width of 100 to 1000 μm, e.g. 400 μm, is irradiated throughout the substrate entirety, whereupon the overlap ratio of linear laser beam may be taken 50 to 98%.

Then, the surface of the semiconductor layer is cleaned by an etchant containing a hydrogen fluoride, to form a gate insulating film 202 covering the semiconductor layer. The gate insulating film 202 is formed by an insulating film containing silicon having a thickness of 40 to 150 nm by the use of a plasma CVD or sputtering. In this example, a silicon oxide nitride film is formed (composition ratio: Si=32%, O=59%, N=7% and H=2%) to have a thickness of 115 nm by a plasma CVD. Of course, the gate insulating film 202 is not limited to a silicon oxide nitride film but may be made in a single layer or a lamination of layers of insulating films containing other form of silicon.

After cleaning the surface of the gate insulating film 202, a gate electrode 210 is formed.

Then, a p-type providing impurity element (such as B), herein, adequate amounts of boron is added to the semiconductor to form a source region 211 and a drain region 212. After the addition of the impurity element, heating process, intense light radiation or laser irradiation is made in order to activate the impurity element. Simultaneously with activation, restoration is possible from the plasma damage to the gate insulating film or from the plasma damage at the interface between the gate insulating film and the semiconductor layer. Particularly, it is extremely effective to irradiate the second harmonic of a YAG laser at a main or back surface thereby activating the impurity element in an atmosphere at room temperature to 300° C. YAG laser is preferable activating means since it requires a few maintenances.

In the subsequent process, after hydrogenation is carried out, an insulator 213a made from an organic or inorganic material (for example, from a photosensitive organic resin) is formed, then, an aluminum nitride film, an aluminum oxynitride film shown as $AlN_xO_y$, or a first protection film 213b made from a silicon nitride film are formed. The film shown as $AlN_xO_y$ is formed by introducing oxygen, nitrogen, or rear gas from the gas inlet system by RF sputtering using a target made of AlN or Al. The content of nitrogen in the $AlN_xO_y$ film may be in the range of at least several atom %, or 2.5 to 47.5 atom %, and the content of oxygen may be in the range of at most 47.5 atom %, preferably, less than 0.01 to 20 atom %. A contact hole is formed therein reaching the source region 211 or drain region 212. Next, a source electrode (wiring) 215 and a drain electrode 214 are formed to complete a TFT (p-channel TFT). This TFT will control the current that is supplied to LED (Light Emitting Device).

Also, the present invention is not limited to the TFT structure of this example, but, if required, may be in a lightly doped drain (LDD) structure having an LDD region between the channel region and the drain region (or source region). This structure is formed with a region an impurity element is added with light concentration between the channel formation region and the source or drain region formed by adding an impurity element with high concentration, which is called an LDD region. Furthermore, it may be in, what is called, a GOLD (Gate-drain Overlapped LDD) structure arranging an LDD region overlapped with a gate electrode through a gate insulating film. It is preferable that the gate electrode is formed in a lamination structure and etched to have a different taper angle of an upper gate electrode and a lower gate electrode to form an LDD region and a GOLD region in a self-aligning manner using the gate electrode as a mask.

Meanwhile, although explanation herein was by using the p-channel TFT, it is needless to say that an n-channel TFT can be formed by using an n-type impurity element (P, As, etc.) in place of the p-type impurity element.

Subsequently, in the pixel portion, a first electrode 217 in contact with a connecting electrode in contact with the drain region is arranged in matrix shape. This first electrode 217 serves as an anode or a cathode of the light-emitting element. Then, a insulator (generally referred to as a bank, a partition, a barrier, a mound, or the like) 216 that covers the end portion of the first electrode 217 is formed. For the insulator 216, a photosensitive organic resin is used. In the case of using a negative type photosensitive acrylic resin is used as a material of the insulator 216, for example, the insulator 216 may be preferably prepared such that the upper end portion of the insulator 216 has a curved surface having a first curvature radius and the lower end portion of the insulator has a curved surface having a second curvature radius. Each of the first and second curvature radiuses may be preferably in the range of 0.2 μm to 3 μm. Furthermore, a layer 218 containing an organic compound is formed in the pixel portion, and a second electrode 219 is then formed thereon to complete an EL element. This second electrode 219 serves as a cathode or an anode of the EL element.

The insulator 216 that covers the end portion of the first electrode 217 may be covered with a second protective film formed of an aluminum nitride film, an aluminum nitride oxide film, or a silicon nitride film.

Figure 10B:
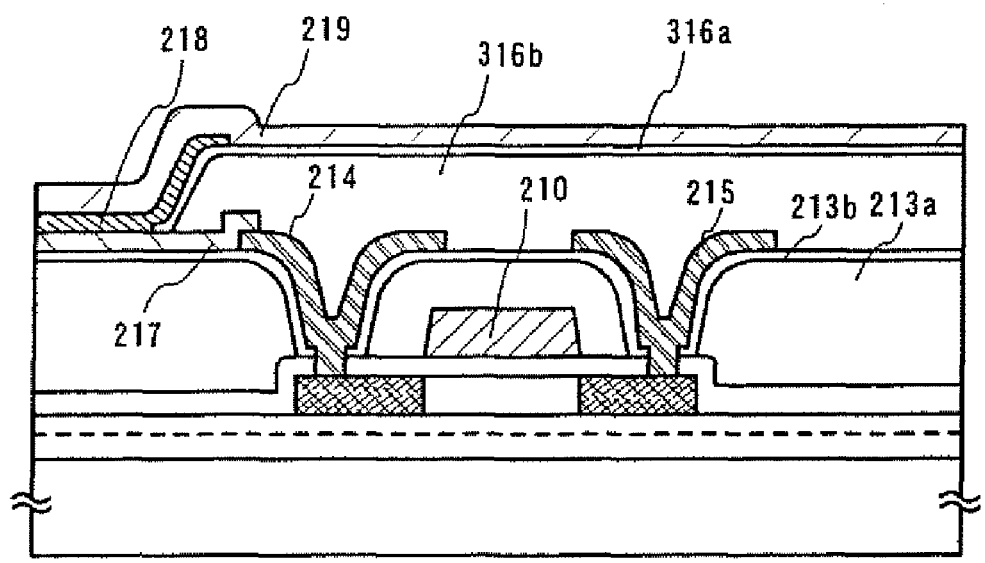

For instance, an example of using a positive type photosensitive acrylic resin as a material of the insulator 216 is shown in FIG. 10B. The insulator 316a has a curved surface having a curvature radius only the upper end thereof. Furthermore, the insulator 316a is covered with a second protective film 316b formed of an aluminum nitride film, an aluminum nitride oxide film, or a silicon nitride film.

For instance, when the first electrode 217 is used as an anode, the material of the first electrode 217 may be a metal (i.e., Pt, Cr, W, Ni, Zn, Sn, or In) having a large work function. The end portion of such an electrode 217 is covered with the insulator (generally referred to as a bank, a partition, a barrier, a mound, or the like) 216 or 316, then, a vacuum-evaporation is carried out moving an evaporation source along with the insulator 216, 316a, or 316b by using the evaporation device shown in Embodiment 1 or 2. For example, a deposition chamber is vacuum-exhausted until the degree of vacuum reaches $5\times10^{-3}$ Torr (0.665 Pa) or less, preferably $10^{-4}$ to $10^{-6}$ Pa, for vacuum-evaporation. Prior to vacuum-evaporation, the organic compound is vaporized by resistance heating. The vaporized organic compound is scattered on the substrate as the shutter is opened for vacuum-evaporation. The vaporized organic compound is scattered upward, then, deposited on the substrate through an opening formed in a metal mask. A light emitting layer (including a hole transporting layer, a hole injection layer, an electron transporting layer, and an electron injection layer) is formed.

In the case that a layer containing an organic compound is formed that emits white luminescence in its entirety by vacuum-evaporation, it can be formed by depositing each light emitting layer. For instance, an $Alq_3$ film, an $Alq_3$ film partially doped with Nile red which is a red light emitting pigment, a p-EtTAZ film, and a TPD (aromatic diamine) film are layered in this order to obtain white light.

In case of using vacuum-evaporation, as shown in Embodiment 3, a melting pot in which an EL material that a vacuum-evaporation material is stored in advance by a material maker is set in a deposition chamber. Preferably, the melting pot is set in the deposition chamber while avoiding contact with the air. A melting pot shipped from a material maker is preferably sealed in a second container during shipment and is introduced into a deposition chamber in that state. Desirably, a chamber having vacuum exhaust means is connected to the deposition chamber, the melting pot is taken out of the second container in vacuum or in an inert gas atmosphere in this chamber, and then the melting pot is set in the deposition chamber. In this way, the melting pot and the EL material stored in the melting pot are protected from contamination.

The second electrode 219 comprises a laminate structure of a metal (e.g., Li, Mg, or Cs) having a small work function; and a transparent conductive film (made of an indium tin oxide (ITO) alloy, an indium zinc oxide alloy ($In_2O_3$—ZnO), zinc oxide (ZnO), or the like) on the thin film. For attaining a low-resistance cathode, an auxiliary electrode may be provided on the insulator 216 or 316. The light-emitting element thus obtained emits white luminescence. Here, the example in which the layer 218 containing the organic compound is formed by vacuum-evaporation has been described. According to the present invention, however, it is not limited to a specific method and the layer 218 may be formed using a coating method (a spin coating method, an ink jet method).

In this example, an example of depositing layers made from low molecular material as an organic compound layer is described though, both high molecular materials and low molecular materials may also be deposited.

It can be thought that there are two types of structures of an active matrix light emitting device having TFT in terms of radiating direction of luminescence. One is a structure that luminescence generated in a light emitting element can be observed passing through the second electrode, and can be manufactured using the above-mentioned steps.

Another structure is that luminescence generated in the light emitting element is irradiated into the eyes of the observer after passing through the first electrode, it is preferable that the first electrode 217 may be prepared using a material having a translucency. For instance, when the first electrode 217 is provided as an anode, a transparent conductive film (made of an indium tin oxide (ITO) alloy, an indium zinc oxide alloy ($In_2O_3$—ZnO), zinc oxide (ZnO), or the like)

is used for a material of the first electrode 217 and the end portion thereof is covered with the insulator (generally referred to as a bank, a partition, a barrier, a mound, or the like) 216, followed by forming the layer 218 containing an organic compound. On this layer, furthermore, a second electrode 219 formed of a metal film (i.e., an alloy of MgAg, MgIn, AlLi, $CaF_2$, CaN, or the like, or a film formed by a co-vacuum-evaporation of an element of Group I and Group II in the periodic table and aluminum) is formed as a cathode. Here, a resistive heating method using vacuum-evaporation is used for the formation of a cathode, so that the cathode can be selectively formed using a vacuum-evaporation mask.

After forming the second electrode 219 by the steps described above, a seal substrate is laminated using a sealing material to encapsulate the light-emitting element formed on the substrate 200.

Though a top gate TFT is described as an example in this example, the present invention can be applied irrespective of TFT's structure. For example, the present invention can be applied to a bottom gate (reverse stagger) TFT and a forward stagger TFT.

Figure 19:
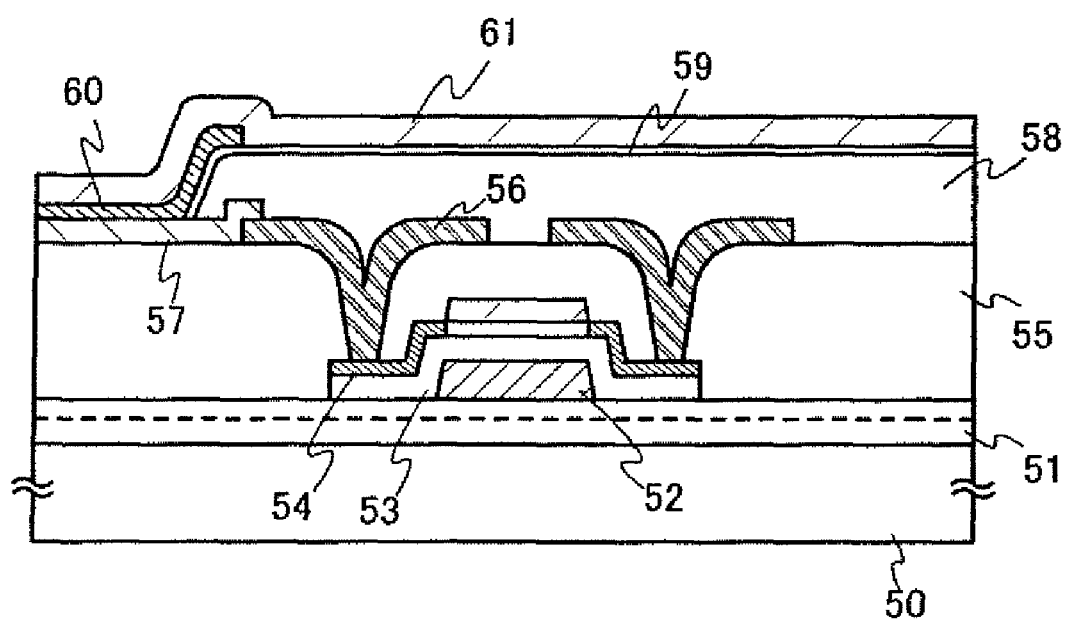
FIG. 19 is a view showing a light emitting device according to the invention.

For instance, as shown in FIG. 19, a bottom gate structure is composed of a base insulating film 51, a gate electrode 52, a gate insulating film 53, a semiconductor film 54 having an impurity region and a channel formation region, an interlayer insulating film 55, which are formed on a substrate 50. A contact hole is formed in the position that corresponds to an impurity region in a semiconductor film. A source/drain wiring 56 is formed in the contact hole. Hereinafter, as same as FIG. 10, a first electrode 57 that covers the end portion of a source/drain wiring, an insulating film 58 that covers the end portion of the first electrode, a protective film 59 that covers the insulating film 58, a layer containing an organic compounds, and a second electrode 61 are formed. In FIG. 19, since an inorganic material is used for the interlayer insulating film 55 and an organic material is used for the insulating film 58, the protective film 59 having nitride such as silicon nitride is provided as a protective film for covering the insulating film 58.

In the case that such bottom gate type is adopted to the TFT having an amorphous semiconductor film, since crystallization is not necessary to be conducted, a material of aluminum or the like that has low heat resistance can be used for a gate electrode.

Further, an appearance view of an active matrix type light-emitting device is described with reference to FIG. 11. Further, FIG. 11A is a top view showing the light emitting apparatus and FIG. 11B is a sectional view constituted by cutting FIG. 11A by a line A-A'. A source signal side driving circuit 1101, a pixel portion 1102, and a gate signal line driving circuit 1103 are formed on a substrate 1110. An inner side surrounded by a seal substrate 1104, the sealing material 1105, and the substrate 1110 constitutes a space 1107.

Further, a wiring 1108 for transmitting signals inputted to the source signal side driving circuit 1101 and the gate signal side driving circuit 1103 receives a video signal or a clock signal from FPC (flexible printed circuit) 1109 for constituting an external input terminal. Although only FPC is illustrated here, the FPC may be attached with a printed wiring substrate (PWB). The light emitting apparatus in the specification includes not only a main body of the light emitting apparatus but also a state in which FPC or PWB is attached thereto.

Next, a sectional structure will be explained in reference to FIG. 11B. Driver circuits and the pixel portion are formed over a substrate 1110 and here, the source signal line driving circuit 1101 as the driver circuit and the pixel portion 1102 are shown.

Further, the source signal line driving circuit 1101 is formed with a CMOS circuit combined with an n-channel type TFT 1123 and a p-channel type TFT 1124. Further, TFT for forming the driver circuit may be formed by a publicly-known CMOS circuit, PMOS circuit or NMOS circuit. Further, although according to this example, a driver integrated type formed with the driver circuits over the substrate is shown, the driver integrated type is not necessarily be needed and the driver circuits can be formed not over the substrate but at outside thereof.

Further, the pixel portion 1102 is formed of a plurality of pixels each including a switching TFT 1111, a current controlling TFT 1112, and a first electrode (anode) 1113 electrically connected to a drain of the current controlling TFT 1112.

Further, an insulating layer 1114 is formed at both ends of the first electrode (anode) 1113 and an organic compound layer 1115 is formed on the first electrode (anode) 1113. The organic compound layer 1115 is formed by moving an evaporation source along with the insulating film 1114 by using the device shown in Embodiments 1 and 2. Further, a second electrode (cathode) 1116 is formed over the organic compound layer 1115. As a result, a light-emitting element 1118 comprising the first electrode (anode) 1112, the organic compound layer 1115 and the second electrode (cathode) 1116 is formed. Here, the light-emitting element 1118 shows an example of white color luminescence and therefore, provided with the color filter comprising a coloring layer 1131 and a light-shielding layer 1132 (for simplification, overcoat layer is not illustrated here). As shown an example that a coloring layer or color filter is formed in the white color luminescence element in FIG. 18, a color filter can be formed instead of a coloring layer and both a coloring layer and a color filter can be formed.

In FIG. 18, a color filter is formed at the side of a seal substrate 1104 since it is the structure that light emitted from a light emitting element is observed through the second electrode, however, in case of the structure that light emitted from a light emitting element is observed through the first electrode, a color filter is formed at the side of the substrate 1110.

The second electrode (cathode) 1116 functions also as a wiring common to all the pixels and electrically connected to FPC 1109 via the connection wiring 1108. The third electrode (auxiliary electrode) 1117 is formed on the insulating layer 1114 to realize to make the second electrode have a low resistance.

Further, in order to encapsulate the light-emitting element 1118 formed over the substrate 1110, the seal substrate 1104 is pasted by the sealing material 1105. Further, a spacer comprising a resin film may be provided for ensuring an interval between the seal substrate 1104 and the light-emitting element 1118. Further, the space 1107 on the inner side of the sealing material 1105 is filled with an inert gas of nitrogen or the like. Further, it is preferable to use epoxy species resin for the sealing material 1105. Further, it is preferable that the sealing material 1105 is a material for permeating moisture or oxygen as less as possible. Further, the inner portion of the space 1107 may be included with the substance having an effect of absorbing oxygen or moisture.

Further, according to the example, as a material for constituting the seal substrate 1104, other than glass substrate or quartz substrate, a plastic substrate comprising FRP (Fiber-glass-Reinforced Plastics), PVF polyvinyl fluoride), Mylar, polyester or acrylic resin can be used. Further, it is possible to adhere the seal substrate 1104 by using the sealing material 1105 and thereafter seal to cover a side face (exposed face) by a sealing material.

By encapsulating the light-emitting element as described above, the light-emitting element can completely be blocked from outside and a substance for expediting to deteriorate the organic compound layer such as moisture or oxygen can be prevented from invading from outside. Therefore, the highly reliable light-emitting device can be provided.

Further, this example can be freely combined with Embodiments 1 to 3.

Example 2

According to the example, FIG. 12 shows an example of a fabricating device of a multichamber system fully automating fabrication of from a first electrode to sealing.

FIG. 12 shows a multichamber fabricating device having gates 100a through 100x, a preparing chamber 101, a take-out chamber 119, carrying chambers 102, 104a, 108, 114 and 118, delivery chambers 105, 107 and 111, deposition chambers 106R, 106B, 106G, 106H, 106E, 109, 110, 112 and 113, installing chambers for installing evaporation sources 126R, 126G, 126B, 126E and 126H, a pretreatment chamber 103, a sealed substrate loading chamber 117, a sealing chamber 116, cassette chambers 111a and 111b, a tray mounting stage 121, a cleaning chamber 122, a baking chamber 123 and a mask stock chamber 124.

A procedure of carrying a substrate previously provided with a thin film transistor, an anode and an insulator for covering an end portion of the anode to the fabricating device shown in FIG. 12 and fabricating a light emitting device will be shown as follows.

First, the substrate is set to the cassette chamber 120a or the cassette chamber 120b. When the substrate is a large-sized substrate (for example, 300 mm×360 mm), the substrate is set to the cassette chamber 120a or 120b and when the substrate is a normal substrate (for example, 127 mm×127 mm), the substrate is carried to the tray mounting stage 121 and a plurality of the substrate are set to a tray (for example, 300 mm×360 mm).

Successively, the substrate provided with pluralities of thin film transistors, anodes and insulators for covering the end portions of the anodes is carried to the carrying chamber 118 and carried to the cleaning chamber 122 to remove an impurity (small particle or the like) on the surface of the substrate by a solution. When the substrate is cleaned at the cleaning chamber 122, a face of the substrate to be formed with a film is set to direct downwardly under the atmospheric pressure. Successively, the substrate is carried to the baking chamber 123 to vaporize the solution by heating.

Successively, the substrate is carried to the deposition chamber 112 and an organic compound layer operating as a hole injecting layer is formed on an entire face of the substrate previously provided with the pluralities of thin film transistors, anodes and insulators for covering end portions of anodes. According to the example, a film of copper phthalocyaninne (CuPc) is formed by 20 nm. Further, when PEDOT is formed as a hole injecting layer, PEDOT may be formed by a spin coating method by providing a spin coater at the deposition chamber 112. Further, when an organic compound layer is formed by the spin coating method at the deposition chamber 112, a face of the substrate to be deposited with film is set to direct upwardly under the atmospheric pressure. At this occasion, when the film is formed by using water or an organic solvent as a solvent, the substrate is carried to the baking chamber 123 for sintering and moisture is vaporized by carrying out a heating treatment in vacuum.

Successively, the substrate is carried from the carrying chamber 118 provided with a substrate carrying mechanism to the preparing chamber 101. According to the fabricating device of the embodiment, the preparing chamber 101 is provided with a substrate reversing mechanism and the substrate can pertinently be reversed. The preparing chamber 101 is connected to a vacuuming chamber and it is preferable to bring the preparing chamber 101 under the atmospheric pressure by introducing an inert gas after vacuuming.

Successively, the substrate is carried to the carrying chamber 102 connected to the preparing chamber 101. It is preferable to maintain vacuum by previously vacuuming such that moisture or oxygen is present as less as possible at inside of the carrying chamber 102.

Further, the vacuuming chamber is provided with a turbomolecular pump of a magnetic levitation type, a cryopump or a dry pump. Thereby, an ultimate vacuum degree of the carrying chamber connected to the preparing chamber can be made to fall in a range of $10^{-5}$ through $10^{-6}$ Pa and inverse diffusion of an impurity from a pump side and an exhaust system can be controlled. In order to prevent an impurity from introducing to inside of the device, as a gas to be introduced, an inert gas of nitrogen, a rare gas or the like is used. There is used the gases introduced into the device which are highly purified by a gas refiner before being introduced into the device. Therefore, it is necessary to provide the gas refiner such that the gas is introduced into the evaporation device after having been purified highly. Thereby, an impurity of oxygen, water or the like included in the gas, can previously be removed and therefore, the impurity can be prevented from being introduced into the device.

Further, when a film including an organic compound formed at a useless portion is intended to remove, the substrate may be carried to the pretreatment chamber 103 to selectively remove a laminated layer of the organic compound film by using a metal mask. The pretreatment chamber 103 includes plasma generating means and dry etching is carried out by generating plasma by exciting a single kind or a plurality of kinds of gases selected from the group consisting of Ar, H, F and O. Further, it is preferable to carry out an annealing operation for degassing in vacuum in order to remove moisture or other gas included in the substrate and the substrate may be carried to the pretreatment chamber 103 connected to the carrying chamber 102 to anneal.

Successively, the substrate is carried from the carrying chamber 102 to the delivery chamber 105 and from the delivery chamber 105 to the carrying chamber 104a without being exposed to the atmosphere. Further, an organic compound layer comprising low molecules for constituting a hole transporting layer or a light emitting layer is formed on the hole injecting layer (CuPc) provided on the entire face of the substrate. Although for a whole of a light emitting element, an organic compound layer indicating light emittance of single color (specifically, white color), or full color (specifically, red color, green color, blue color) can be formed, in this example, an explanation will be given of an example of forming organic compound layers indicating light emittance of red color, green color, blue color at the respective deposition chambers 106R, 106G and 106B by an evaporation method.

First, the respective deposition chambers 106R, 106G and 106B will be explained. The respective deposition chamber 106R, 106G and 106B are installed with movable evaporation source holders described in Embodiments 1 and 2. A plurality of the evaporation source holders are prepared, a first evaporation source holder is filled with an EL material for forming a hole transporting layer of each color, a second evaporation source holder is filled with an EL material for forming a light emitting layer of each color, a third evaporation source holder is filled with an EL material for forming an electron transporting layer of each color and a fourth evaporation source holder is filled with an EL material for forming an electron injecting layer of each color and the respective evaporation source holders are installed at the respective deposition chambers 106R, 106G and 106B under the state.

In installing the substrate to the respective deposition chambers, it is preferable to use the fabricating system described in Embodiment 3 and install vessels (representatively, crucibles) previously contained with the EL materials by the material maker directly to the deposition chambers. Further, in installing the vessel, it is preferable to install the vessel without being brought into contact with the atmosphere and in carrying the vessel from the material maker, it is preferable to introduce the crucible into the deposition chamber in a state of being hermetically sealed in the second vessel. Preferably the installing chambers 126R, 126G and 126B having vacuuming means connected to the respective deposition chambers 106R, 106G and 106B are brought into vacuum or in an inert gas atmosphere and under the atmosphere, the crucible is taken out from the second vessel and the crucible is installed at the deposition chamber. Thereby, the crucible and the EL material contained in the crucible can be prevented from contamination.

Next, a deposition step will be explained. First, a metal mask contained in the mask stock chamber 124 is carried to install at the deposition chamber 106R. Further, the hole transporting layer is formed by using the mask. In the example, a film of α-NPD is formed by 60 nm. Thereafter, by using same mask, a light emitting layer of red color is formed and the electron transporting layer and the electron injecting layer are successively formed. According to the example, a film of Alq$_3$ added with DCM is formed by 40 nm as the light emitting layer, a film of Alq$_3$ is formed by 40 nm as an electron transporting layer and a layer of CaF$_2$ is formed by 1 nm as the electron injecting layer.

Specifically, at the deposition chamber 106R, in the state of installing the mask, the first evaporation source holder installed with the EL material of the hole transporting layer, the second evaporation source holder installed with the EL material of the light emitting layer, the third evaporation source holder installed with the EL material of the electron transporting layer and the fourth evaporation source holder installed with the electron injecting layer are successively moved to carry out film formation. Further, in forming the films, the organic compounds are vaporized by resistance heating and in forming the films, the organic compounds are scattered to the direction of the substrate by opening shutters (not illustrated) provided at the evaporation source holders. The vaporized organic compounds are scattered upwardly and vapor-deposited to the substrate by passing an opening portion (not illustrated) provided at the metal mask (not illustrated) pertinently installed to form the films.

In this way, without being opened to the atmosphere, in the single forming chamber, the light emitting element (from hole transporting layer to electron injecting layer) emitting light in red color can be formed. Further, the layers continuously formed in the single deposition chamber are not limited to the hole transporting layer through the electron injecting layer but the layers can pertinently be set by a person for embodying the invention.

Further, the substrate formed with the light emitting element in red color is carried to the deposition chamber 106G by a carrying mechanism 104b. Further, a metal mask contained at the mask stock chamber 124 is carried to install at the deposition chamber 106G. Further, as the mask, the mask in forming the light emitting element in red color may be utilized. Further, the hole transporting layer is formed by using the mask. In the example, a film of α-NPD is formed by 60 nm. Thereafter, the light emitting layer of green color is formed and the electron transporting layer and the electron injecting layer are successively formed by using the same mask. In the example, a film of Alq$_3$ added with DMQD is formed by 40 nm as the light emitting layer, a film of Alq$_3$ is formed by 40 nm as the electron transporting layer and a film of CaF$_2$ is formed by 1 nm as the electron injecting layer.

Specifically, in the deposition chamber 106G, in a state of installing the mask, the first evaporation source holder installed with the EL material of the hole transporting layer, the second evaporation source holder installed with the EL material of the light emitting layer, the third evaporation source holder installed with the EL material of the electron transporting layer and the fourth evaporation source holder installed with the EL material of the electron injecting layer are successively moved to carry out film formation. Further, in forming the films, the organic compounds are vaporized by resistance heating and in forming the films, the organic compounds are scattered in the direction of the substrate by opening shutters (not illustrated) provided at the evaporation source holders. The vaporized organic compounds are scattered upwardly and vapor-deposited to the substrate by passing an opening portion (not illustrated) provided at the metal mask (not illustrated) pertinently installed to form the films.

In this way, without being opened to the atmosphere, in the single deposition chamber, a light emitting element (from hole transporting layer to electron injecting layer) emitting light in green color can be formed. Further, the layers continuously formed in the single deposition chamber are not limited to the hole transporting layer through the electron injecting layer but the layers may pertinently be set by the person for embodying the invention.

Further, the substrate formed with the light emitting element in green color is carried to the deposition chamber 106B by the carrying mechanism 104b. Further, a metal mask contained in the mask stock chamber 124 is carried to install at the deposition chamber 106B. Further, as the mask, the mask in forming the light emitting element in red color or green color may be utilized. Further, films functioning as the hole transporting layer and a light emitting layer in blue color are formed by using the mask. In the example, a film of α-NPD is formed by 60 nm. Thereafter, a blocking layer is formed and the electron transporting layer and the electron injecting layer are successively formed by using the same mask. In the example, a film of BCP is formed by 10 nm as the blocking layer, a film of Alq$_3$ is formed by 40 nm as the electron transporting layer and a film of CaF$_2$ is formed by 1 nm as electron injecting layer.

Specifically, in the deposition chamber 106B, in a state of installing the mask, the first evaporation source holder installed with the EL materials of the hole transporting layer and the light emitting layer in blue color, the second evaporation source holder installed with the EL material of the blocking layer, the third evaporation source holder installed with the EL material of the electron transporting layer and the fourth evaporation source holder installed with the electron injecting layer are successively moved to carry out film formation. Further, in forming the films, the organic compounds are vaporized by resistance heating and in forming the films, the organic compounds are scattered in the direction of the substrate by opening shutters (not illustrated) provided at the evaporation source holders. The vaporized organic compounds are scattered upwardly and vapor-deposited to the substrate by passing an opening portion (not illustrated) provided at the metal mask (not illustrated) pertinently installed to form the films.

In this way, without being opened to the atmosphere, in the single deposition chamber, the light emitting element (hole transporting layer through electron injecting layer) emitting light in green color can be formed. Further, the layers continuously formed in the single deposition chamber are not limited to the hole transporting layer to the electron injecting layer but may pertinently be set by the person for embodying the invention.

Further, an order of forming the films of the respective colors is not limited to that of the example but may pertinently be set by the person for embodying the invention. Further, the hole transporting layer, the electron transporting layer, or the electron injecting layer can be shared by the respective colors. For example, at the deposition chamber 106H, the hole injecting layer or the hole transporting layer common to the light emitting elements of red color, green color and blue color may be formed, and the light emitting layers of the respective colors may be formed at the respective deposition chambers 106R, 106G and 106B and the electron transporting layer or the electron injecting layer common to the light emitting elements of red color, green color and blue color may be formed at the deposition chamber 106E. Further, at each deposition chamber, the organic compound layer indicating light emittance of a single color (specifically, white color) can also be formed.

Further, the films can simultaneously be formed at the respective deposition chambers 106R, 106G and 106B and by successively moving the respective deposition chambers, the light emitting element can efficiently be formed and tact of the light emitting device is promoted. Further, when a certain deposition chamber is subjected to maintenance, the respective light emitting elements can be formed at remaining deposition chambers and the throughput of the light emitting device is promoted.

Further, when the evaporation method is used, it is preferable to carry out evaporation at the deposition chamber vacuumed such that the vacuum degree becomes equal to or lower than $5 \times 10^{-3}$ Torr (0.665 Pa), preferably, $10^{-4}$ through $10^{-6}$ Pa.

Successively, after carrying the substrate from the carrying chamber 104a to the delivery chamber 107, further, without being brought into contact with the atmosphere, the substrate is carried from the delivery chamber 107 to the carrying chamber 108. By the carrying mechanism installed at inside of the carrying chamber 108, the substrate is carried to the deposition chamber 110 and a cathode (lower layer) comprising a very thin metal film (film formed by an alloy of MgAg, MgIn, AlLi, CaN or the like or an element belonging to group 1 or group 2 of the periodic table and aluminum by a common evaporation method) is formed by an evaporation method using resistance heating. After forming the cathode (lower layer) comprising the thin metal layer, the substrate is carried to the deposition chamber 109, by using sputtering method a cathode (upper layer) comprising a transparent conductive film (ITO (indium oxide tin oxide alloy), indium oxide zinc oxide alloy ($In_2O_3$—ZnO), zinc oxide (ZnO) or the like) is formed and the cathode comprising the laminated layers of the thin metal layer and transparent conductive film is pertinently formed.

By the above-described steps, the light emitting element having the laminated layers structure shown in FIGS. 10A and 10B is formed.

Successively, without being brought into contact with the atmosphere, the substrate is carried from the carrying chamber 108 to the deposition chamber 113 and a protective film comprising a silicon nitride film or a silicon nitrooxide film is formed. In this case, inside of the deposition chamber 113 is provided with a sputtering device having a target comprising silicon, a target comprising silicon oxide or a target comprising silicon nitride. For example, the silicon nitride film can be formed by using a target comprising silicon and constituting the atmosphere of the deposition chamber by a nitrogen atmosphere or an atmosphere including nitrogen and argon.

Successively, the substrate formed with the light emitting element is carried from the carrying chamber 108 to the delivery chamber 111 and the from the delivery chamber 111 to the carrying chamber 114 without being brought into contact with the atmosphere. Successively, the substrate formed with the light emitting element is carried from the carrying chamber 114 to the sealing chamber 116. Further, it is preferable to prepare a sealing substrate provided with a sealing member at the sealing chamber 116.

The sealing substrate is prepared by setting the sealing substrate to the sealing substrate loading chamber 117 from outside. Further, it is preferable to anneal the sealing substrate previously in vacuum in order to remove an impurity of moisture or the like, for example, to anneal at inside of the sealing substrate loading chamber 117. Further, when the sealing member for pasting together with the substrate provided with the light emitting element at the sealing substrate, after subjecting the carrying chamber 108 to the atmospheric pressure, the sealing member is formed at the sealing substrate between the sealing substrate loading chamber and the carrying chamber 114 and the sealing substrate formed with the sealing member is carried to the sealing chamber 116. Further, a desiccant may be provided to the sealing substrate in the sealing substrate loading chamber.

Successively, in order to degas the substrate provided with the light emitting element, after annealing in vacuum or an inert atmosphere, the sealing substrate provided with the sealing member and the substrate formed with the light emitting element are pasted together. Further, nitrogen or an inert gas is filled in a hermetically sealed space. Further, although an example of forming the sealing member at the sealing substrate is shown here, the invention is not particularly limited thereto but the sealing member may be formed at the substrate formed with the light emitting element.

Successively, a pair of the substrates pasted together is irradiated with UV light by an ultraviolet ray irradiating mechanism provided at the sealing chamber 116 to thereby cure the sealing member. Further, although an ultraviolet ray cured resin is used as the sealing member, so far as the sealing member is an adhering member, the sealing member is not particularly limited thereto.

Successively, the pair of substrates pasted together is carried from the sealing chamber 116 to the carrying chamber 114 and from the carrying chamber 114 to the take-out chamber 119 and taken out.

As described above, by using the fabricating device shown in FIG. 12, the light emitting element is not exposed to the atmosphere until completely sealing the light emitting element into the hermetically sealed space and therefore, a highly reliable light emitting device can be fabricated. Further, although in the carrying chamber 114, vacuum and the nitrogen atmosphere under the atmospheric pressure are repeated, it is preferable that vacuum is always maintained in the carrying chambers 102, 104a and 108.

Further, a fabricating device of an in-line system can also be constituted.

Further, a light emitting element having a light emitting direction reverse to that in the laminated layers structure can also be formed by carrying a transparent conductive film as an anode to the fabricating device shown in FIG. 12.

Further, the example can freely combined with Embodiments 1 through 3 and Example 1.

Example 3

Figure 13:
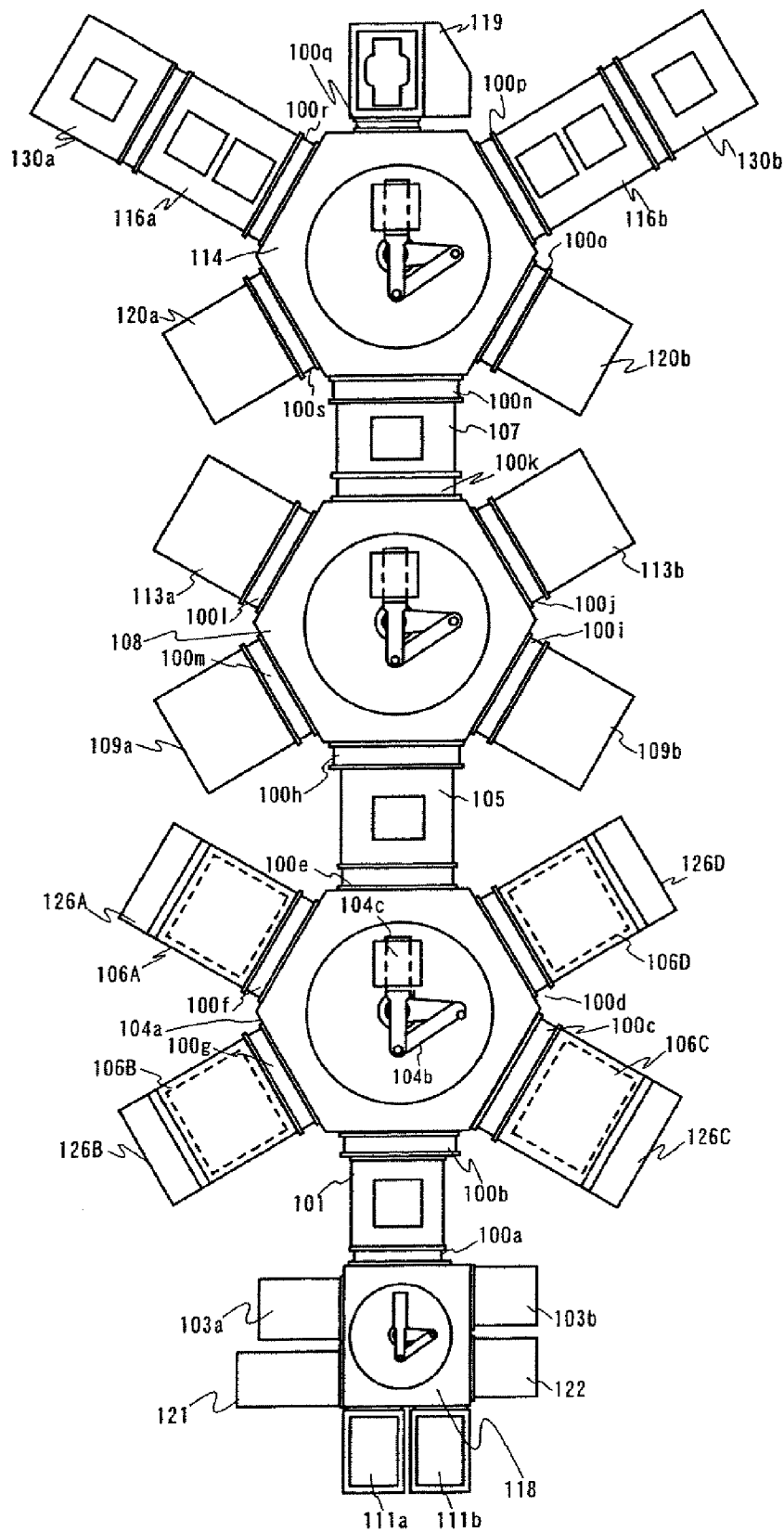
FIG. 13 is a view showing an evaporation device according to the invention.
Figure 14:
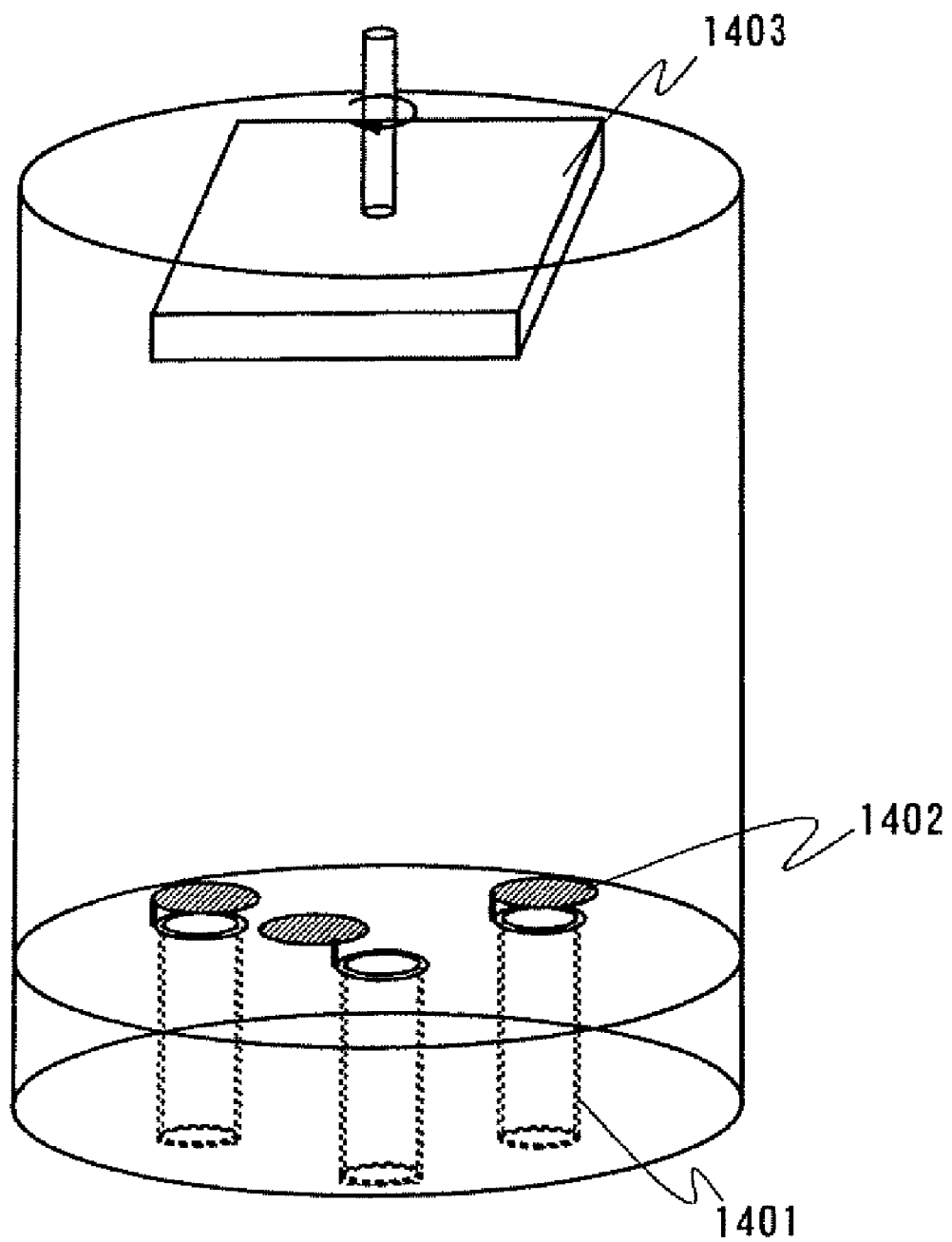
FIG. 14 is a view showing an evaporation device.

In the example, FIG. 13 shows an example of a fabricating device of a multichamber system fully automating fabrication from the first electrode to sealing different from that of Example 2.

FIG. 13 shows a multichamber fabricating device including gates 100a through 100s, the take-out chamber 119, the carrying chambers 104a, 108, 114 and 118, the delivery chambers 105 and 107, the preparing chamber 101, a first deposition chamber 106A, a second deposition chamber 106B, a third deposition chamber 106C, a fourth deposition chamber 106D, other deposition chambers 109a, 109b, 113a and 113b, processing chambers 120a and 120b, installing chambers installed with evaporation sources 126A, 126B, 126C and 126D, pretreatment chambers 103a, 103b, a first sealing chamber 116a, a second sealing chamber 116b, a first stock chamber 130a, a second stock chamber 130b, the cassette chambers 111a and 111b, the tray mounting stage 121 and the cleaning chamber 122.

The following shows a procedure of carrying a substrate previously provided with a thin film transistor, an anode and an insulator covering an end portion of the anode to the fabricating device shown in FIG. 13 and of fabricating a light emitting device.

First, the substrate is set to the cassette chamber 111a or the cassette chamber 111b. When the substrate is a large-sized substrate (for example, 300 mm×360 mm), the substrate is set to the cassette chamber 111a or 111b and when the substrate is the normal substrate (for example, 127 mm×127 mm), the substrate is carried to the tray mounting stage 121 and a plurality of the substrates are set to a tray (for example, 300 mm×360 mm).

Successively, the substrate provided with a plurality of thin film transistors, anodes and insulators covering end portions of the anodes is carried to the carrying chamber 118 and carried to the cleaning chamber 122 to remove an impurity (small particle or the like) at the surface of the substrate by a solution. When the substrate is cleaned at the cleaning chamber 122, a face of the substrate to be deposited with a film is set to direct downwardly under the atmospheric pressure.

Further, when a film including an organic compound formed at a useless portion is intended to remove, the substrate may be carried to the pretreatment chamber 103 and a laminated layer of the organic compound film may selectively be removed. The pretreatment chamber 103 includes plasma generating means for carrying out dry etching by generating plasma by exciting a single kind or a plurality of kinds of gases selected from the group consisting of Ar, H, F and O. Further, in order to remove moisture included in the substrate or other gas or reduce plasma damage, it is preferable to carry out annealing operation in vacuum and the substrate may be carried to the pretreatment chamber 103 and subject the substrate to annealing operation (for example, UV irradiation). Further, in order to remove moisture included in an organic resin material or other gas, the substrate may be heated under a low pressure atmosphere at the pretreatment chamber 103.

Successively, the substrate is carried from the carrying chamber 118 provided with the substrate carrying mechanism to the preparing chamber 101. According to the fabricating device of the example, the preparing chamber 101 is provided with a substrate reversing mechanism to enable to reverse the substrate pertinently. The preparing chamber 101 is connected to a vacuuming chamber and after vacuuming, it is preferable to subject the preparing chamber 101 to the atmospheric pressure by introducing an inert gas.

Successively, the substrate is carried to the carrying chamber 104a connected to the preparing chamber 101. It is preferable to maintain vacuum by previously vacuuming the carrying chamber 104a such that moisture or oxygen is present as less as possible at inside thereof.

Further, the vacuuming chamber is provided with a turbo-molecular pump of a magnetic levitation type, a cryopump or a dray pump. Thereby, the ultimate vacuum degree of the carrying chamber connected to the preparing chamber can be made to fall in a range of $10^{-5}$ through $10^{-6}$ Pa and reverse diffusion of impurity from a pump side and the exhaust system can be controlled. In order to prevent an impurity from being introduced into the device, as a gas to be introduced, an inert gas of nitrogen or rare gas is used. The gas is introduced into the device which is highly purified by a gas refiner before being introduced into the device is used. Therefore, it is necessary to provide a gas refiner such that the gases are introduced into the evaporation device after having been highly purified. Thereby, oxygen or water included in the gas and other impurity can previously be removed and therefore, impurities can be prevented from being introduced into the device.

Successively, the substrate is carried from the carrying chamber 104a to the first through the fourth deposition chambers 106A through 106D. Further, an organic compound layer comprising low molecules for constituting a hole injecting layer, a hole transporting layer or a light emitting layer is formed.

Although for whole of a light emitting element, an organic compound layer indicating light emittance of a single color (specifically, white color) or full color (specifically, red color, green color, blue color) can be formed, in this example, an explanation will be given of an example of simultaneously forming an organic compound layer indicating light emittance of white color at the respective deposition chambers 106A, 106B, 106C and 106D. Further, simultaneous film formation mentioned here signifies that the film formations are carried out substantially simultaneously in starting film formation and in finishing film formation at the respective deposition chambers and indicates that the deposition processings are carried out substantially in parallel.

Further, although when light emitting layers having different luminescent colors are laminated, an organic compound layer indicating light emittance of white color is grossly classified into three wavelength type including three original colors of red color, green color and blue color and two wavelength type using a relationship of complementary color of blue color/yellow color or bluish green color/orange color, in this example, one example of providing a white color light emitting element using the three wavelengths type will be explained.

First, the respective deposition chambers 106A, 106B, 106C and 106D will be explained. Each of the deposition chambers 106A, 106B, 106C and 106D is installed with a movable evaporation source holder described in Embodiment 1. A plurality of the evaporation source holders are prepared, a first evaporation source holder is filled with aromatic diamine (TPD) for forming a white color light emitting layer, a second evaporation source holder is filled with p-EtTAZ for forming a white color luminescent layer, a third evaporation source holder is filled with Alq$_3$ for forming a white color luminescent layer, a fourth evaporation source holder is filled with an El material constituted by adding NileRed which is a red color luminescent colorant to Alq$_3$ for forming a white color luminescent layer, a fifth evaporation source holder is filled with Alq$_3$ and the evaporation source holders are installed at the respective deposition chambers under the state.

It is preferable to install the EL materials to the deposition chambers by using the fabricating system described in Embodiment 3. That is, it is preferable to form the film by using a vessel (representatively, crucible) contained with the EL material previously by a material maker. Further, when installed, it is preferable to install the crucible without being brought into contact with the atmosphere and when transferred from the material maker, it is preferable that the crucible is introduced into the deposition chamber in a state of being hermetically sealed in the second vessel. Preferably, the installing chambers 126A, 126B, 126C and 126D having vacuuming means connected to the respective deposition chambers 106A, 106B, 106C and 106D are brought in vacuum or an inert gas atmosphere, a crucible is taken out from the second vessel under the atmosphere and the crucible is installed to the deposition chamber. Thereby, the crucible and the EL material contained in the crucible can be prevented from being contaminated. Further, the installing chambers 126A, 126B, 126C and 126D can stock a metal mask.

Next, deposition steps will be explained. In the deposition chamber 106A, a mask is carried and installed from the installing chamber as necessary. Thereafter, the is first through the fifth evaporation source holders start moving successively and evaporation is carried out for the substrate. Specifically, TPD is sublimated from the first evaporation source holder by heating and vapor-deposited over the entire face of the substrate. Thereafter, p-EtTAZ is sublimated from the second evaporation source holder, Alq$_3$ is sublimated from the third evaporation source holder, Alq$_3$: NileRed is sublimated from the fourth evaporation source holder and Alq$_3$ is sublimated from the fifth evaporation source holder and vapor-deposited over the entire face of the substrate.

Further, when the evaporation method is used, it is preferable to carry out evaporation at the deposition chamber vacuumed in which the vacuum degree becomes $5 \times 10^{-3}$ Torr (0.665 Pa) or lower, preferably $10^{-4}$ through $10^{-6}$ Pa.

Further, the evaporation source holders installed with the respective EL materials are provided at the respective deposition chambers 106B through 106D, evaporation is carried out similarly. That is, the deposition processing can be carried out in parallel. Therefore, even when a certain deposition chamber is subjected to maintenance or cleaning, the deposition processing can be carried out at remaining deposition chambers, tact of film formation is promoted and therefore, the throughput of the light emitting device can be promoted.

Successively, after carrying the substrate from the carrying chamber 104a to the delivery chamber 105, further, without being brought into contact with the atmosphere, the substrate is carried from the delivery chamber 105 to the carrying chamber 108.

Successively, by the carrying mechanism installed at inside of the carrying chamber 108, the substrate is carried to the deposition chamber 109a or the deposition chamber 109b to form a cathode. The cathode may be formed by laminated films of a cathode (lower layer) comprising a very thin metal film (film formed by an alloy of MgAg, MgIn, AlLi, CaN or the like or an element belonging to group 1 or group 2 of the periodic table and aluminum by a common evaporation method) formed by an evaporation method using resistance heating, and a cathode (upper layer) comprising a transparent conductive film (ITO (indium oxide indium tin alloy), indium oxide zinc oxide alloy (In$_2$O$_2$—ZnO), zinc oxide (ZnO) or the like) formed by a sputtering method. For that purpose, it is preferable to arrange a deposition chamber for forming a very thin metal film at the fabricating device.

By the above-described steps, the light emitting element having the laminated layers structure shown in FIGS. 10A and 10B is formed.

Successively, without being brought into contact with the atmosphere, the substrate is carried from the carrying chamber 108 to the deposition chamber 113a or the deposition chamber 113b and a protective film comprising a silicon nitride film or a silicon nitrooxide film is formed. In this case, inside of the deposition chamber 113a or 113b is provided with a target comprising silicon, or a target comprising silicon oxide, or a target comprising silicon nitride. For example, a silicon nitride film can be formed by using a target comprising silicon and constituting an atmosphere of the deposition chamber by a nitrogen atmosphere or an atmosphere including nitrogen and argon.

Successively, without bringing the substrate formed with the light emitting element in contact with the atmosphere, the substrate is carried from the carrying chamber 108 to the delivery chamber 107 and carried from the delivery chamber 107 to the carrying chamber 114.

Successively, the substrate formed with the light emitting element is carried from the carrying chamber 114 to the processing chamber 120a or the processing chamber 120b. At the processing chamber 120a or 120b, a sealing member is formed on the substrate. Further, although in the example, an ultraviolet ray cured resin is used for the sealing member, for far as the sealing member is an adhering member, the sealing member is not particularly limited thereto. Further, the sealing member may be formed after setting the processing chamber 120a or 120b to the atmospheric pressure. Further, the substrate formed with the sealing member is carried to the first sealing chamber 116a or the second sealing chamber 116b via the carrying chamber 114.

Further, a sealing substrate formed with a color conversion layer, light blocking layer (BM) and an overcoat layer is carried to the first stock chamber 130a or the second stock chamber 130b. Further, a sealing substrate laminated not with the color conversion layer but with a color filter or the color conversion layer and the color filter as shown by FIGS. 18a and 18c may be provided. Thereafter, the sealing substrate is carried to the first sealing chamber 130a or the second sealing chamber 130b.

Successively, by carrying out annealing operation in vacuum or in an inert atmosphere, the substrate provided with the light emitting element is degassed and thereafter, the substrate provided with the sealing member and the substrate formed with the color conversion layer or the like are pasted together. Further, nitrogen or an inert gas is filled in a hermetically sealed space. Further, although an example of forming the sealing member at the substrate is shown here, the invention is not particularly limited thereto but the sealing material may be formed at the sealing substrate. That is, the sealing substrate may be formed with the color conversion layer, the color blocking layer (BM), the overcoat layer and the sealing member and thereafter carried to the first stock chamber 130a or the second stock chamber 130b.

Successively, the pair of substrates pasted together are irradiated with UV light using an UV light irradiation mechanism provided in the first sealing chamber 116a or the second sealing chamber 116b to cure the sealing member.

Successively, the pair of substrates pasted together are carried from the sealing chamber 116 to the carrying chamber 114 and from the carrying chamber 114 to the take-out chamber 119 and taken out.

As described above, by using the fabricating device shown in FIG. 13, the light emitting element is not exposed to the atmosphere until the light emitting element is sealed in the hermetically sealed space and therefore, a highly reliable light emitting device can be fabricated. Further, although in the carrying chamber 114, vacuum and a nitrogen atmosphere under the atmospheric pressure are repeated, it is preferable that the vacuum is always maintained in the carrying chambers 102 and 104a and 108.

Further, an in-line system fabricating device can be constituted.

It is also possible to carry a transparent conductive film as an anode to the fabricating device shown in FIG. 13 and form a light emitting element having a light emitting direction reverse to that in the laminated layers structure.

Figure 15:
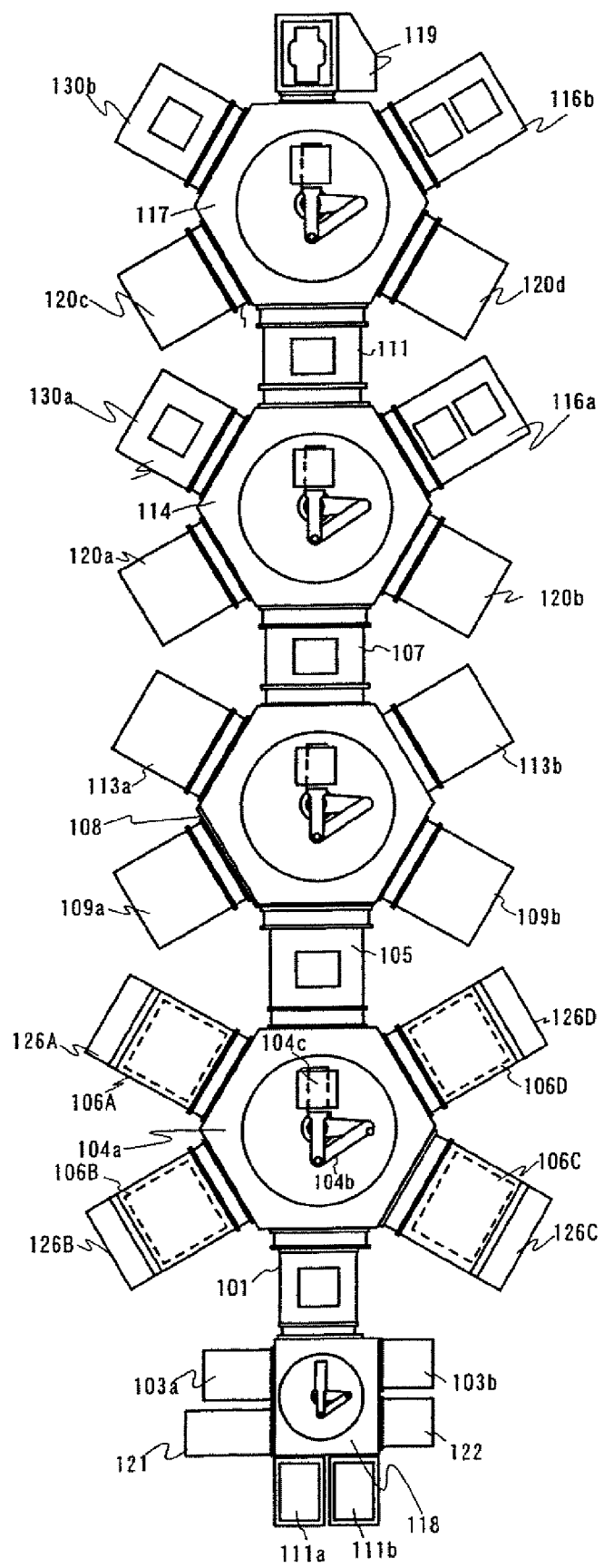
FIG. 15 is a view showing an evaporation device according to the invention.

FIG. 15 shows an example of a fabricating device different from that of FIG. 13. Film formation may be carried out similarly to FIG. 13 and therefore, a detailed explanation of deposition steps will be omitted, a point of difference in the constitution of the fabricating device resides in that a delivery chamber 111 and a carrying chamber 117 are additionally provided and the carrying chamber 117 is provided with a second sealing chamber 116b, a second stock chamber 130b and deposition chambers (for forming seal) 120c and 120d. That is, in FIG. 15, all of the deposition chamber, the sealing chamber and the stock chamber are directly connected to a certain carrying chamber and therefore, the substrate is carried efficiently, further, the light emitting device can be fabricated in parallel and the throughput of the light emitting device is promoted.

Further, the parallel processing method of the light emitting device of the example can be combined with Example 2. That is, the deposition processing may be carried out by providing a plurality of the deposition chambers 106R, 106G and 106B.

Further, the example can freely be combined with the embodiments and Example 1.

Example 4

Given as examples of an electric appliance that employs a light emitting device manufactured in accordance with the present invention are video cameras, digital cameras, goggle type displays (head mounted displays), navigation systems, audio reproducing devices (such as car audio and audio components), laptop computers, game machines, portable information terminals (such as mobile computers, cellular phones, portable game machines, and electronic books), and image reproducing devices equipped with recording media (specifically, devices with a display device that can reproduce data in a recording medium such as a digital versatile disk (DVD) to display an image of the data). Wide viewing angle is important particularly for portable information terminals because their screens are often slanted when they are looked at. Therefore it is preferable for portable information terminals to employ the light emitting device using the light emitting element. Specific examples of these electric appliance are shown in FIGS. 16A to 16H.

Figure 16A:
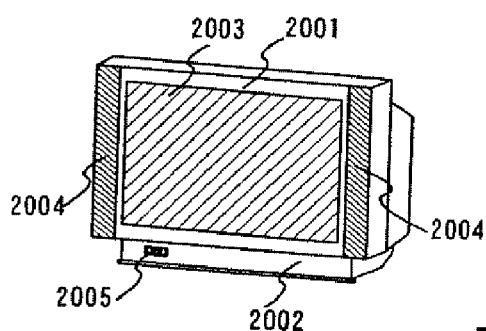
FIG. 16A through FIG. 16H are views showing examples of electronic device using the invention.

FIG. 16A shows a light emitting device, which is composed of a case 2001, a support base 2002, a display unit 2003, speaker units 2004, a video input terminal 2005, etc. The light emitting device manufactured in accordance with the present invention can be applied to the display unit 2003. In addition, the light emitting device shown in FIG. 16A can be completed by the present invention. Since the light emitting device having the light emitting element is self-luminous, the device does not need back light and can make a thinner display unit than liquid crystal display devices. The light emitting device refers to all light emitting devices for displaying information, including ones for personal computers, for TV broadcasting reception, and for advertisement.

Figure 16B:
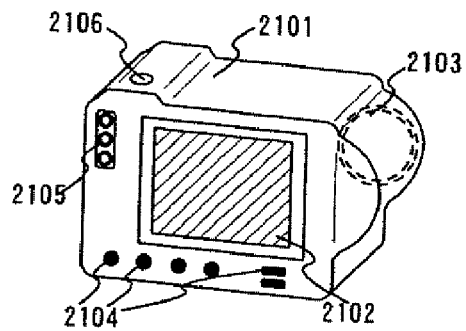

FIG. 16B shows a digital still camera, which is composed of a main body 2101, a display unit 2102, an image receiving unit 2103, operation keys 2104, an external connection port 2105, a shutter 2106, etc. The light emitting device manufactured in accordance with the present invention can be applied to the display unit 2102. The digital camera shown in FIG. 16B can be completed by the present invention.

Figure 16C:
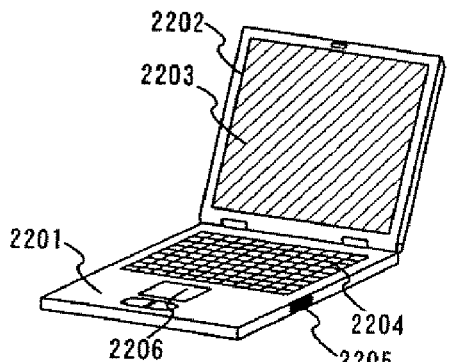

FIG. 16C shows a laptop computer, which is composed of a main body 2201, a case 2202, a display unit 2203, a keyboard 2204, an external connection port 2205, a pointing mouse 2206, etc. The light emitting device manufactured in accordance with the present invention can be applied to the display unit 2203. The laptop computer shown in FIG. 16C can be completed by the present invention.

Figure 16D:
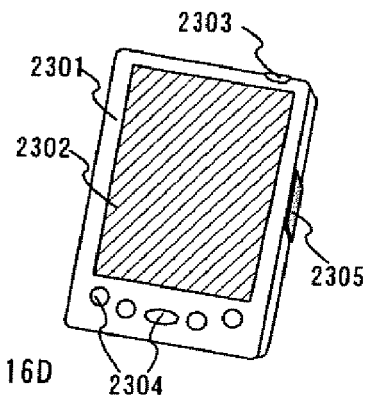

FIG. 16D shows a mobile computer, which is composed of a main body 2301, a display unit 2302, a switch 2303, operation keys 2304, an infrared port 2305, etc. The light emitting device manufactured in accordance with the present invention can be applied to the display unit 2302. The mobile computer shown in FIG. 16D can be completed by the present invention.

Figure 16E:
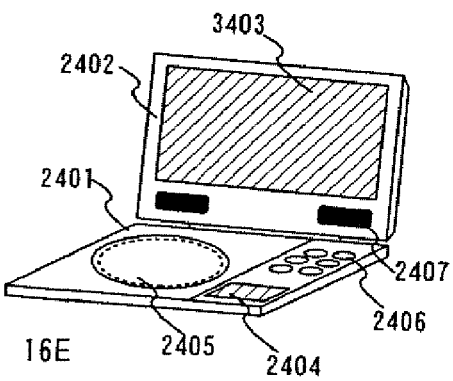

FIG. 16E shows a portable image reproducing device equipped with a recording medium (a DVD player, to be specific). The device is composed of a main is body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The light emitting device manufactured in accordance with the present invention can be applied to the display units A 2403 and B 2404. The image reproducing device equipped with a recording medium also includes home-video game machines. The DVD player shown in FIG. 16E can be completed by the present invention.

Figure 16F:
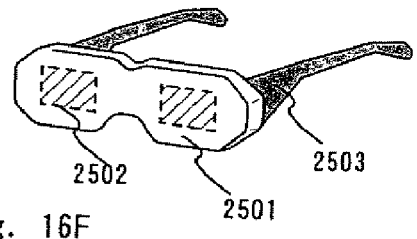

FIG. 16F shows a goggle type display (head mounted display), which is composed of a main body 2501, display units 2502, and arm units 2503. The light emitting device manufactured in accordance with the present invention can be applied to the display units 2502. The goggle type display shown in FIG. 16F can be completed by the present invention.

Figure 16G:
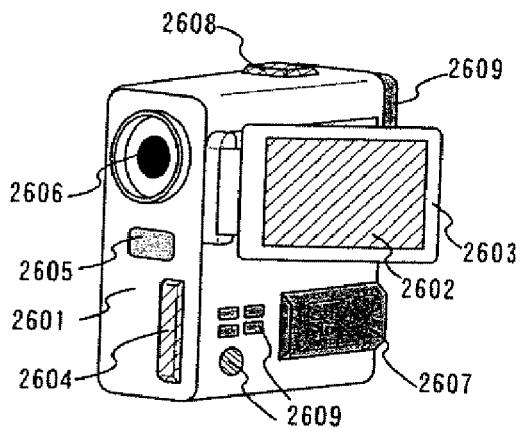

FIG. 16G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609 etc. The light emitting device manufactured in accordance with the present invention can be applied to the display unit 2602. The video camera shown in FIG. 16G can be completed by the present invention.

Figure 16H:
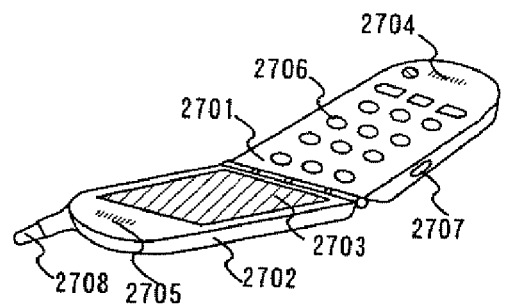

FIG. 16H shows a cellular phone, which is composed of a main body 2701, a case 2702, a display unit 2703, an audio input unit 2704, an audio output unit 2705, operation keys 2706, an external connection port 2707, an antenna 2708, etc. The light emitting device manufactured in accordance with the present invention can be applied to the display unit 2703. If the display unit 2703 displays white letters on black background, the cellular phone consumes less power. The cellular phone shown in FIG. 16H can be completed by the present invention.

If the luminance of luminescence materials is raised in future, the light emitting device can be used in front or rear projectors by enlarging outputted light that contains image information through a lens or the like and projecting the light.

These electric appliances now display with increasing frequency information sent through electronic communication lines such as the Internet and CATV (cable television), especially, animation information. Since luminescence materials have very fast response speed, the light emitting device is suitable for animation display.

According to the invention, the distance between the substrate and the evaporation source holder can be shortened and the small-sized formation of the evaporation device can be achieved. Further, since the evaporation device becomes small-sized, adherence of the sublimated evaporation material to the inner wall or the adherence preventive shield at inside of the deposition chamber is reduced and the evaporation material can effectively be utilized. Further, in the evaporation method of the invention, it is not necessary to rotate the substrate and therefore, the evaporation device capable of dealing with a large area substrate can be provided.

Further, the invention can provide the fabricating device in which the plurality of deposition chambers for carrying out the evaporation processings are continuously arranged. In this way the parallel processings are carried out in the plurality of deposition chambers and therefore, throughput of the light emitting device is promoted.

Further, the invention can provide the fabricating system capable of installing the vessel filled with the evaporation material directly to the evaporation system without exposing the vessel to the atmosphere. By the invention, handling of the evaporation material is facilitated and an impurity can be avoided from being mixed to the evaporation material. By the fabricating system, the vessel filled by the material maker can directly be installed to the evaporation device and therefore, oxygen or water can be prevented from adhering to the evaporation material and further high purity formation of the light emitting element in the future can be dealt with.

What is claimed is:

1. An evaporation apparatus comprising:
   an evaporation chamber;
   an evaporation source holder in the evaporation chamber;
   a first heater in the evaporation source holder;
   a shutter over the evaporation source holder;
   a filter over the shutter;
   a second heater in the evaporation chamber, the second heater surrounding the filter; and
   a moving mechanism,
   wherein the first heater is configured to hold a vessel which is capable of holding an evaporation material to be deposited on a substrate, and
   wherein the moving mechanism is configured to move the evaporation source holder during evaporation of the evaporation material.

2. The evaporation apparatus according to claim 1, wherein the first heater is shaped to conform to fully cover an outside surface of the vessel.

3. The evaporation apparatus according to claim 1, wherein the filter is formed of a conductive material.

4. An evaporation apparatus comprising:
   an evaporation chamber; and
   an evaporation source holder in the evaporation chamber, the evaporation source holder being configured to hold a plurality of vessels therein; and
   a moving mechanism,
   wherein the plurality of vessels are capable of holding an evaporation material to be deposited on a substrate,
   wherein each of the plurality of vessels comprises:
      a first heater surrounding the vessel;
      a shutter over each of the vessel;
      a filter over the shutter; and
      a second heater which is provided over the shutter and configured to surround the filter, and
   wherein the moving mechanism is configured to move the evaporation source holder during evaporation of the evaporation material.

5. The evaporation apparatus according to claim 4, wherein the first heater is shaped to conform to fully cover an outside surface of the vessel.

6. The evaporation apparatus according to claim 4, wherein the filter is formed of a conductive material.

7. The evaporation apparatus according to claim 4, wherein the second heater is provided in the evaporation chamber.

* * * * *